(12) United States Patent
Falik et al.

(10) Patent No.: US 7,579,683 B1
(45) Date of Patent: Aug. 25, 2009

(54) MEMORY INTERFACE OPTIMIZED FOR STACKED CONFIGURATIONS

(75) Inventors: Ohad Falik, Kfar Saba (IL); Aviv Melinovitch, Herzlia (IL)

(73) Assignee: National Semiconductor Corporation, Santa Clara, CA (US)

( * ) Notice: Subject to any disclaimer, the term of this patent is extended or adjusted under 35 U.S.C. 154(b) by 676 days.

(21) Appl. No.: 10/934,113

(22) Filed: Sep. 3, 2004

Related U.S. Application Data

(60) Provisional application No. 60/583,922, filed on Jun. 29, 2004, provisional application No. 60/583,919, filed on Jun. 29, 2004, provisional application No. 60/583,921, filed on Jun. 29, 2004, provisional application No. 60/583,923, filed on Jun. 29, 2004, provisional application No. 60/583,918, filed on Jun. 29, 2004.

(51) Int. Cl.
*H01L 23/48* (2006.01)
(52) U.S. Cl. ............... 257/690; 257/678; 257/684; 257/691; 257/737; 711/157; 711/219
(58) Field of Classification Search .......... 257/660, 257/678, 684, 690, 691, 737; 711/157, 219
See application file for complete search history.

(56) References Cited

U.S. PATENT DOCUMENTS

| | | | | |
|---|---|---|---|---|
| 5,761,456 A * | 6/1998 | Titus et al. | ............. | 710/305 |
| 6,093,942 A * | 7/2000 | Sei et al. | ............. | 257/203 |
| 6,235,554 B1 * | 5/2001 | Akram et al. | ............. | 438/109 |
| 6,324,678 B1 * | 11/2001 | Dangelo et al. | ............. | 716/18 |
| 6,605,875 B2 * | 8/2003 | Eskildsen | ............. | 257/777 |
| 2003/0067059 A1 * | 4/2003 | Corisis | ............. | 257/666 |
| 2004/0201563 A1 * | 10/2004 | Kobayashi | ............. | 345/100 |

* cited by examiner

*Primary Examiner*—N Drew Richards
*Assistant Examiner*—Joannie A Garcia

(57) ABSTRACT

A semiconductor die includes a plurality of interconnection pads for connecting with a memory die. The two dies are packaged together in a stacked manner. The plurality of pads are disposed so that the circuit layout of the semiconductor die is invariable with respect to the size of the memory die within a given range of sizes.

20 Claims, 16 Drawing Sheets

FIG. 5A

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Field Name | Clock Frequency | | | | | | (Reserved) | | | | | Erase Error | Protection Error | Program Error | Double Buffer Error | Ready |
| Reset | 0 | 1 | 0 | 0 | 1 | 0 | 0 | 0 | 0 | 0 | 0 | 0 | 0 | 0 | 1 | 1 |

FIG. 5B

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Field Name | Self-timed Flash | Double Program Buffer | Program Buffer Size | | Number of Address Buffers | | | | Read While Program | | Bus Widths Support | | | | | |
| Reset | 0 | 0 | 0 | 0 | val | | | | val | | val | | | | | |

| Bit | 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|---|
| Field Name | (Reserved) | | | | | | | | | | | | Number of Sections Sub-Block 2 | | Number of Sections Sub-Block 1 | |
| Reset | 0 | 0 | 0 | 0 | 0 | 0 | 0 | 0 | 0 | 0 | 0 | 0 | val | val | val | val |

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Field Name | Information Block Size | | | Page Size | | | | Main Block Size | | | | | | | 0 |
| Reset | 0 | 0 | 0 | 0 | 0 | 0 | 0 | 0 | 0 | 0 | 0 | 0 | 0 | 0 | 0 | 0 |

| Bit | 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|---|
| Field Name | Sub-Block | (Reserved) | | | | | | | | | | | | val | val | val |
| Reset | 0 | 0 | 0 | 0 | 0 | 0 | 0 | 0 | 0 | 0 | 0 | 0 | 0 | val | val | val |

FIG. 5C

| Bit | 7 | 6 | 5 | 4 | 3 | 2 | 1 | 0 |
|---|---|---|---|---|---|---|---|---|
| Field Name | Enable Verifying | Engineering Register Access | Enable Erasing Chip | Enable Erasing Complete Section | Enable Erasing Information Block Section | Enable Erasing Main Block Section | Enable Erasing Page | Enable Programming |
| Reset | 0 | 0 | 0 | 0 | 0 | 0 | 0 | 0 |

FIG. 5D

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Field Name | Manufacturer ID ||||||||| Interface Specification Revision |||||||
| Reset | val ||||||||| val |||||||

| Bit | 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|---|
| Field Name | Device Revision |||| Device Identification ||||||||||||
| Reset | val |||| val ||||||||||||

FIG. 5E

| Bit | 7 | 6 | 5 | 4 | 3 | 2 | 1 | 0 |
|---|---|---|---|---|---|---|---|---|
| Field Name | (Reserved) | ERPW | Set Bus Width |||| Power Down | Reset |
| Reset | 0 | 0 | 0 | 0 | 0 | 0 | 0 | 0 |

FIG. 5F

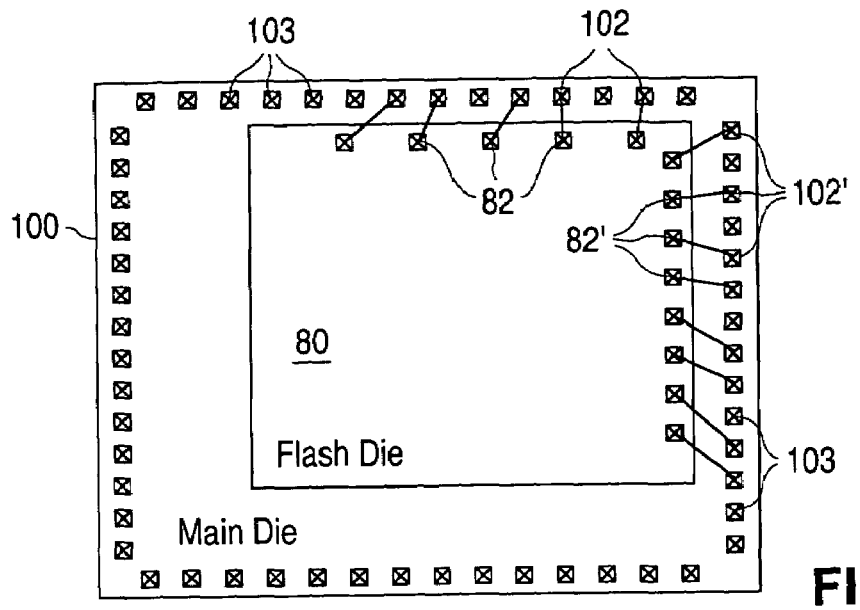
FIG. 10A1
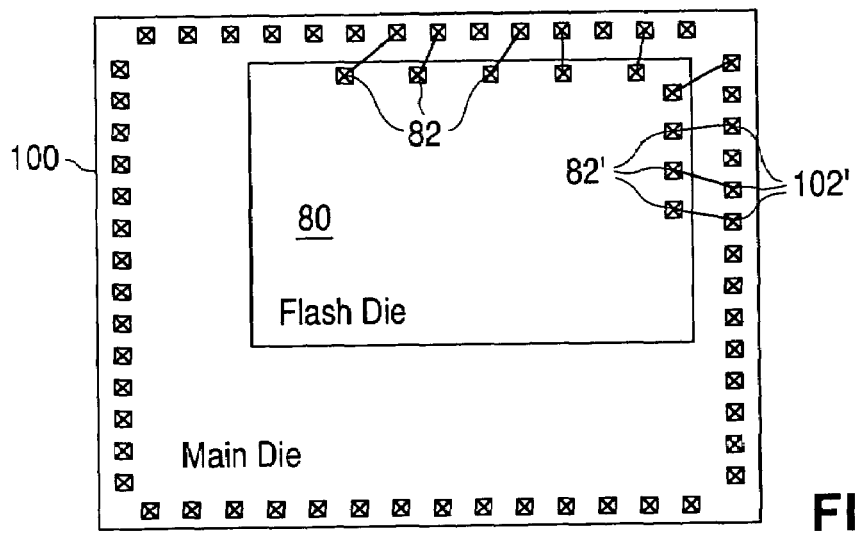
FIG. 10A2
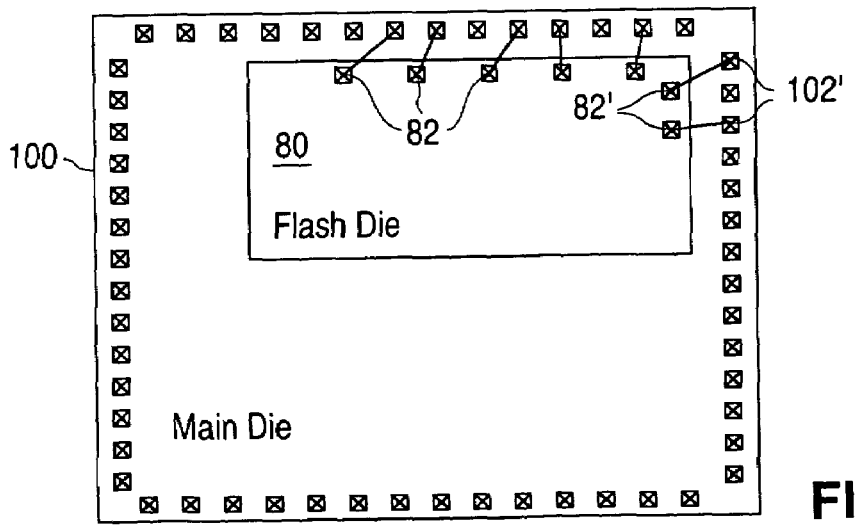
FIG. 10A3

MEMORY INTERFACE OPTIMIZED FOR STACKED CONFIGURATIONS

CROSS-REFERENCE TO RELATED APPLICATIONS

This application claims the benefit of priority under 35 U.S.C. §119(e)(1) of provisional application Ser. No. 60/583,922 filed on Jun. 29, 2004 and provisional application Ser. No. 60/583,919 filed Jun. 29, 2004, and provisional application Ser. No. 60/583,921 filed Jun. 29, 2004 and provisional application Ser. No. 60/583,923 filed Jun. 29, 2004 and provisional application Ser. No. 60/583,918 filed Jun. 29, 2004 are incorporated herein by reference for all purposes.

The above application is commonly assigned to the assignee of the present invention. The disclosures of these related patent applications are hereby incorporated by reference for all purposes as if fully set forth herein.

TECHNICAL FIELD OF THE INVENTION

This invention relates to communication between semiconductor devices and, in particular, to an interface between a main die and a memory die.

BACKGROUND OF THE INVENTION

It is generally known to interconnect two semiconductor devices, one serving for data processing and the other, containing a memory array, serving for data storage. In most common systems, the interconnection is via a bus to which also other devices, as well as multiple memory devices, are connected. Each device is usually implemented as a die, mounted in a suitable package. Certain class types of memory devices, such as flash memory, static random-access memory (SRAM) and electrically erasable programmable read-only memory (EEPROM—implemented also in flash technology), have special structures and characteristics, including moderate operational speed, and, on the other hand, need to be very frequently and readily accessible by the processing device. For these reasons memory devices of such classes are often directly connected, possible via an exclusive bus, to the processing device; often they are also packaged together, in a stacked manner, whereby the interconnecting lines become very short. In effect, this arrangement creates a pair of interactive dies. Because of the special structure and characteristics of the memory device, the mechanical and electrical structure of the interconnection and the protocols governing the interface between the devices are, in prior art, custom designed for the particular pair; moreover, the circuit layout of the processing device is often designed so as to place connecting pads at locations that enable connection to the particular memory device. Thus, in general, prior art requires, for any given type of processing device, a different design of the mechanical and electrical interface, as well as of the processing die's circuit layout, for each different type of memory device. Such a set of interfaces, moreover, would generally, vary among different types of processing device. Furthermore, the characteristics of each memory device to be connected need to be stored in the processing device. Connecting buses of prior art are also characterized by having separate lines for addresses and for data, and/or separate lines for inflow and outflow (relative to the main device). Additionally, interfaces of prior art are designed for only a limited number of bus widths and memory status and control signals are conveyed inefficiently. Moreover, interfaces of prior art do not automatically enable simultaneous access to the memory by a plurality of processes (multiple streams) and generally do not support timing of the memory device based on the clock signal of a synchronous bus.

There is, thus, a need for a standard interface between a processing (or main) device and a memory device that is suitable for a wide range of memory device types, as well as of main device types and that will enable coupling of a main device to a variety of memory devices with relatively minor modifications to its hardware and software. Such a standard interface need also enable efficient data communication between the devices and use a minimal number of connecting lines, while maintaining flexibility in the bus width. There may also be a need for the standard interface to enable simultaneous access to the memory by a plurality of processes and/or to support timing of the memory device based on the clock signal of the synchronous bus. Optionally there may also be a need for the standard interface to connect a plurality of memory devices to a main device, possibly all packaged in a stack.

A list, with brief descriptions, of related prior art follows.

U.S. Pat. No. 5,761,456, to Titus, et al., discloses a processor device and method for booting a programmable apparatus having a signal bus having a selectable bus width. The processor device includes a microprocessor, a configurable bus interface for coupling the microprocessor to the signal bus, and a first memory. The first memory includes a bus sizing code for instructing the microprocessor for reading initial data from a pre-determined address of a second memory and configuring the bus interface to the bus width that has been selected.

U.S. Pat. No. 6,016,270, to Thummalapally, et al., discloses a flash memory architecture that relies on a single, time-shared address bus to enable a read operation to be performed simultaneously with an algorithm operation when the read operation is targeted for a memory cell block that is not currently tagged for an algorithm operation. After a read address has been latched into the array block selected for the read operation, the address bus is "free" for the remainder of the read operation cycle. During this free time, the address bus can be used for algorithm operations to load the counter address into an active tagged block in the array. Separate global data I/O lines are provided to facilitate simultaneous read and algorithm operations.

U.S. Pat. No. 6,235,554, to Akram, et al., discloses a stackable chip scale semiconductor package and a method for fabricating the package. The package includes a substrate having a die mounting site wherein a semiconductor die is mounted. The package also includes first contacts formed on a first surface of the substrate, and second contacts formed on an opposing second surface of the substrate. Conductive vias in the substrate electrically connect the first contacts to the second contacts. In addition, the first contacts and the second contacts have a mating configuration, such that a second package can be stacked on and electrically connected to the package.

U.S. Pat. No. 6,298,426, to Ajanovic, discloses a memory controller for use with a memory sub-system selected to have one of multiple memory organizations. The memory controller includes output drivers connected to output pins, the output drivers being programmable to have one of multiple output characteristics. The memory controller also includes a configuration register storing a programmable value that determines the output characteristic.

U.S. Pat. No. 6,472,747, to Bazarjani, et al., discloses techniques for fabricating analog and digital circuits on separate dies and stacking and integrating the dies within a single package to form a mixed-signal IC that provides many benefits. In one aspect, the analog and digital circuits are implemented on two separate dies using possibly different IC processes suitable for these different types of circuits. The analog and digital dies are thereafter integrated (stacked) and encapsulated within the single package. Bonding pads are provided to interconnect the dies and to connect the dies to external pins. The bonding pads may be located and arranged in a manner to provide the required connectivity while minimizing the amount of die area required to implement the pads.

U.S. Pat. No. 6,605,875, to Eskildsen, discloses an integrated circuit die having bond pads near adjacent sides to allow stacking of dice without regard to dice size. A lower die has keep out areas on its top surface. The keep out areas correspond to two adjacent edges of the lower die. The lower die has bond pads within the keep out areas. An upper die is stacked on the top surface of the lower die such that the bond pads within the keep out areas of the lower die are exposed to accept wire bonds. The configuration of the keep out areas next to adjacent edges of the lower die thus provides flexibility in the design of stacked chip packages because the size of the upper die is not limited by the bond pad configuration of the lower die.

U.S. Pat. No. 6,618,790, to Talreja, et al., discloses a burst transfer operation with a memory device that can be suspended and resumed without having to provide the current memory address when it is resumed. A chip enable signal to the memory device can be deasserted to initiate the suspend operation and place the memory device in a low power standby mode. When the chip enable signal is reasserted, the memory device can be reactivated and the burst transfer can continue where it stopped, without any setup commands. The current address counter and other bus transfer parameters can be saved within the memory device during the suspend operation. When the suspend operation is terminated by reasserting the chip enable signal, the memory device can resume the transfer using the saved parameters.

U.S. Pat. No. 5,778,413, to Stevens, et al., discloses a memory controller that provides a series of queues between the processor and the PCI bus and the memory system. The memory controller is highly programmable for multiple speeds and types of processors and several speeds of memory devices. The memory controller includes a plurality of registers that specify number of clock periods for the particular portions of a conventional dynamic random access memory cycle which are used to control state machine operations.

U.S. Pat. No. 5,768,560, to Lieberman, et al., discloses a dynamically configurable memory system having a programmable controller including a frequency multiplier to maintain memory timing resolution for different bus speeds.

U.S. Pat. Nos. 6,442,076 and 6,657,899, both to Roohparvar, disclose a synchronous flash memory that includes an array of non-volatile memory cells. The memory array is arranged in rows and columns, and can be further arranged in addressable blocks. Data communication connections are used for bi-directional data communication with an external device(s), such as a processor or other memory controller. The memory can write data to one location, such as a memory array block, while data is read from a second location, such as a second memory array block. The memory automatically provides status data when a read command is received for a memory array location that is currently subject to a write operation. The automatic status output allows multiple processors to access the memory device without substantial bus master overhead. The memory can also output status data in response to a status read command.

U.S. Pat. No. 5,369,754, to Fandrich, et al., discloses a flash memory device having a plurality of flash array blocks and a block status register circuit containing a block status register for storing a block status for each flash array block. A flash array controller circuit in the flash memory device performs program or erase operations on the flash array blocks, and maintains the block status in each block status register. An interface circuit in the flash memory device enables read access of the block status registers over a bus.

AM29LV800B is a flash memory device, commercially available from American Micro Devices. It has a parallel interface, with selectable two bus width and a standard status protocol. features a pair of arrays, with flexible sector architectures, and the ability to simultaneous read from one array and program into the other array. Program operation status is conveyed by a status line.

28F640W18 is a single-die firmware hub (FWH) device that includes a flash memory and is commercially available from Intel Corp. It has a synchronous interface bus.

MT48LC4M32B2 is a SDRAM device by Micron Technolgies. Read and write accesses to the memory are burst oriented; accesses start at a selected location and continue for a programmed number of locations. It also features configuration of access time delay and multiple internal banks.

SST25FV is a flash memory device made by Silicon Storage Technology, Inc. It features a serial SPI interface, whose protocol includes a 'data in' signal, a 'data out' signal, a clock signal, for timing the communication, and a 'chip select' signal. The protocol passes commands and address to the device and serially shifts data in or out of the device. Either a single byte or a sequence of data bytes (burst) may be read or written.

In accordance with exemplary embodiments of a fifth aspect of the invention, for the case that the FD is not self timed, the interface enables it to generate its internal timing signals, whatever they are, from the supplied clock signal that serves the synchronous bus; such generation of timing signals is configurable to a wide range of supplied clock frequencies.

Bearing all this in mind, there is provided, according to the third aspect of the invention, a semiconductor die, comprising a plurality of interconnection pads for connecting with a memory die, the two dies packaged together in a stacked manner, wherein the plurality of pads are disposed so that the circuit layout of the semiconductor die is invariable with respect to the size of the memory die, within a given range of sizes.

Similarly there is provided, according to the third aspect of the invention, a memory die, comprising a plurality of interconnection pads for connecting with a semiconductor die, the two dies packaged together in a stacked manner, wherein the plurality of pads are disposed so that the circuit layout of the memory die is invariable with respect to the size of the semiconductor die, within a given range of sizes.

There is further provided, according to the third aspect of the invention, a semiconductor die, comprising a plurality of interconnection pads for connecting with a memory die, the two dies packaged together in a stacked manner and at least two of the pads forming, each, part of a corresponding data line, for carrying data signals between the two dies, wherein the at least two pads are disposed so that the circuit layout of the semiconductor die is invariable with respect to the number of data lines, up to a given maximum number.

Similarly there is further provided, according to the third aspect of the invention, a memory die, comprising a plurality of interconnection pads for connecting with a semiconductor die, the two dies packaged together in a stacked manner and at least two of the pads forming, each, part of a corresponding data line, for carrying data signals between the two dies, wherein the at least two pads are disposed so that the circuit layout of the memory die is invariable with respect to the number of data lines, up to a given maximum number.

According to another feature of the invention, the plurality of pads are disposed along, at most, two mutually adjacent edges of the semiconductor/memory die.

According to further features of the invention, the at least two pads are disposed along a single edge of the die and the data lines are indexed in a sequential order and the disposition along the edge is in the order in which the corresponding data lines are indexed.

According to alternative features of the invention, there is defined a default number of data lines, which is smaller than the given maximum number, wherein a number of the at least two pads, equal to the default number, are disposed along a first edge of the die and all other of the at least two pads are disposed along a second edge, adjacent to the first edge.

BRIEF DESCRIPTION OF THE DRAWINGS

In order to understand the invention and to see how it may be carried out in practice, a preferred embodiment will now be described, by way of non-limiting example only, with reference to the accompanying drawings, in which like reference numerals represent like parts, and in which:

FIGS. 5A-5F are tables showing the logical structure of various registers in the diagram of FIG. 4;

FIGS. 10A and 10B are schematic diagrams of typical geometric relationship between the two dies of FIG. 1 according to an aspect of the invention.

DETAILED DESCRIPTION

Figure 1:
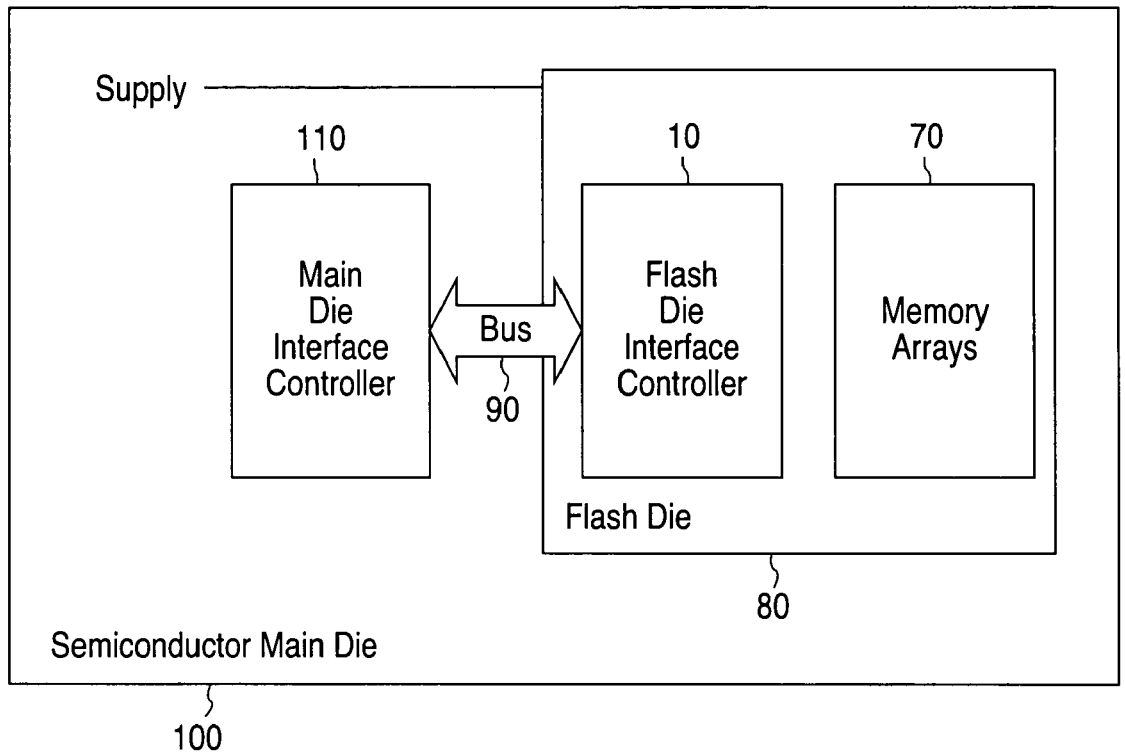
FIG. 1 is a block diagram of an embodiment of the invented interface in the context of devices with which it is associated.

FIGS. 1 through 10B, discussed below, and the various embodiments used to description the principles of the present invention in this patent document are by way of illustration only and should not be construed in any way to limit the scope of the invention. Those skilled in the art will understand that the principles of the present invention may be implemented in any suitably arranged memory interface system.

The present invention facilitates designing a connection and communication between a semiconductor device, such as a digital processor, and a nearby memory device, such as a flash memory, by providing a standard interface that is adaptable to a great variety of device types, at either side, to a variety of operational parameters and to a wide range of widths of the communication link between them. The interface enables design of a relatively standard operation program for the semiconductor processing device to efficiently communicate with the memory device, which program is adaptable to a variety of such processing devices and which, moreover, is adaptive to a variety of memory devices, the parameters of such memory devices being readily available to the program through the interface. The interface is particularly applicable, but not restricted, to types of non-volatile memories, characterized by moderate-speed, or otherwise restricted, mode of operation, such as flash memory, static random-access memory (SRAM) and electrically erasable programmable read-only memory (EEPROM). The interface is also particularly applicable, but not restricted, to connection and communication between a pair of semiconductor dies that are packaged together in a so-called stacked fashion.

In exemplary embodiments, described herein for illustrating the principles of the invention but not to be construed as limiting the scope of the invention, the interface consists of a set of protocols for a synchronous communication link between a semiconductor processing device, to be referred to as the main device (MD), and a memory device, to be interchangeably referred to also as a flash device (FD) without detracting from the generality of the invention. The protocols include a set of signals to be transmitted over the link, a set of commands, to be encoded and sent by the MD and received and decoded by the FD, and a set of functionally defined registers at the FD. The interface also includes specifications for voltages on the physical communication link (to be also referred to as a bus) and for timing the signals and the commands. Characteristically for the interface, while signal transmission over the bus is strictly synchronous with a supplied clock signal, transmission of data between the two devices is highly flexible and adapts itself to the rate of data transfer and processing within the memory device itself. When needed, the interface enables the memory device to derive its own timing from the supplied clock signal. For the case that the two devices are formed as stacked dies, the interface also specifies certain geometric relations for the connecting pads that enable flexibility in the design of each device. As is the case with any interface, the one of the present invention is associated with either one or both of the intercommunicating devices.

In accordance with exemplary embodiments of a first aspect of the invention, the physical bus connecting the two devices may consist of any number of lines, from six upwards, the variable being the number of lines that can carry data signals (referred to as the physical bus width). Moreover, for any given physical bus width, the number of lines to actually carry data, i.e. the number of active data lines, is configurable—between 1 and the given physical width. Each active data line can transmit data in either direction. In the direction from the MD to the FD, transmitted data include command codes, addresses and information data; the latter include control data, to be written into interface registers, and memory contents data, to be written (or programmed, as is the term used in the trade for flash memories) into memory locations. In the direction from the FD to the MD, transmitted data include status data, read from interface registers, and memory contents data, read from memory locations. Contents data are typically transmitted grouped by transactions, or bursts, each transaction initiated by an appropriate command. It is a feature of the invention that the amount of data transmitted during any one transaction is determined solely by the issuing application in the MD and is independent of the configured bus width.

In accordance with exemplary embodiments of a second aspect of the invention, the FD includes one or more memory arrays, each array being associated with certain parameters, such as overall size, word length, page size, etc., which parameters generally differ among multiple arrays; the interface is configurable to each array, whatever its parameters are, enabling the MD to address memory locations in a standard way, yet communicating the parameters to the MD as required.

In accordance with exemplary embodiments of a third aspect of the invention, the MD and the FD are semiconductor dies to be packaged together in a stacked manner; all the pads on the FD die that are to be connected to corresponding pads on the MD, to form a physical bus, are arranged along two adjacent edges of the die. As a result, the design of the MD die is substantially less restricted in the placement of the corresponding pads and is largely independent of the size of the FD die. As another result, one design of the MD is easily adaptable to any physical bus width (e.g. as determined by the FD).

In accordance with exemplary embodiments of a fourth aspect of the invention, multiple transactions, involving corresponding chunks of data that are consecutively stored in the memory, may be carried out as a stream, by means of a series of commands, only the first command of a stream carrying a starting address; the starting address for each subsequent transaction is obtained in the FD by incrementation of an associated address buffer. Moreover, a plurality of strings may be carried concurrently, respective transactions being sequentially interleaved, by providing corresponding address buffers.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "apparatus" and "controller" may be used interchangeably and mean any device, system or part thereof that controls at least one operation, such a device may be implemented in hardware, firmware or software, or some combination of at least two of the same. It should be noted that the functionality associated with any particular apparatus or controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases. The invention is of an interface between a pair of semiconductor devices, one being a digital processing device and one being a memory device, which interface is characterized by certain novel features, as summarized above and as claimed below, and by being adaptable to a large variety of device types and configurations and to a range of interconnection configurations. Any embodiment of any of the aspects of the invention would include a set of protocols and architectural principles applicable generally to each of a plurality of digital processing device types or to each of a plurality of memory device types or to each combination, configuration or interconnection between such a digital processing device and such a memory device. Specification of such protocols and principles, in any embodiment may generally provide for possible wide variation in the types of devices and in the interconnection configuration. In what follows there is described, by way of non-limiting example, an embodiment of an interface between a so-called main die (MD) and a flash-memory die (FD) that are packaged as a stack, which interface is applicable to a wide range of present and future products by the assignee, the range being characterized by various types of MD and of FD, some of which may not yet exist, and a range of numbers of interconnection lines. The embodiment described herebelow (referred to, interchangeably, as the exemplary embodiment, the illustrative embodiment or the exemplary interface) is associated with certain architectural features within the MD and within the FD; this should not be construed as limiting the invention in any way, it being understood that variations of the features, as well as other architectures, are possible within the scope of the invention or any aspect thereof, as claimed below. It will be appreciated that the memory device may be any of a large variety of general types, including, in particular, non-volatile memories, based on various technologies, of which flash is a typical example; it is therefore noted that the reference herein to a flash die and its acronym, FD, is, again, by way of non-limiting example only. It will likewise be appreciated that, while the exemplary embodiment involves a pair of dies that are packaged and interconnected as a stack, the invention is also applicable to other forms of devices, packaging and physical interconnection, such as, but not limited to, mounting on, and interconnection through, a circuit board or a carrier die; hence, the MD, the FD and their interconnecting bus, as described herebelow, are only representative examples of corresponding devices and communication links.

It is noted that flash memories have certain characteristics that distinguish them from other types of memory devices, one of the characteristics being the manner of writing data into the memory and another being the manner of erasing data from memory. During a writing process, any element in a flash memory can be switched only from a '1' state (which is considered the null state) to a '0' state but not vice-versa; an attempt to "write" a '1' into a location will result in the state of the element remaining unchanged. Therefore, in order to write data into any portion of the memory, that portion need, generally, be first erased, i.e. all its elements be switched to '1' state and then elements are switched selectively to '0' according to the data. Now, typically for flash memories, erasure can be done only to a group of adjacent elements together, the smallest group being called a page. Therefore, writing data into a flash memory, and especially writing into only a part of a page, requires special managing of the writing process, including appropriate formatting or encoding of the data and sequencing of writing operations with erasing operations. Such managing is known in the art and is, generally, done routinely by any MD in its communication with any FD. The role of the interface of the present invention is merely to facilitate the communication between the devices of data to be written into the memory, of whatever contents, as well as of data read out of it, and of the appropriate requests for erasure, in whatever sequence. Because of the special nature of the writing process in flash memories, it is customary in the industry to refer to such writing as 'programming'. Accordingly, the terms 'to program', 'programming' and 'program' (as an adjective or a proper name), etc. will be used throughout the description of the exemplary embodiment to denote the equivalent, in the context of flash memories, of 'to write', 'writing' and 'write', etc., respectively, and should be thus interpreted when applying the principles taught herein to embodiments with other types of memory devices. It may be noted that where the term 'writing', etc., does appear in this description, it usually refers, distinctly, to operations across the bus, e.g. when writing to a register or to a buffer, though it may, at times, also refer to operations in the memory arrays, where this is clear. It will be appreciated that, while the present description refers to a pair of dies, namely a main device and a memory device, the invention is directly applicable to the case of a plurality of memory devices being connected to a main device (whether in a stack or otherwise)—each through a separate bus. The invention is, furthermore, extendable to the case that the plurality of memory devices are connected to a main device through a single, common, bus. Such extension would require minor modifications, such as those indicated in the description below with reference to the exemplary embodiment. The term memory devices (in plural) includes the case of a plurality of memory devices, having separate ports, being present on a single die.

The description to follow does not constitute a complete specification, but discloses the essential and novel features of the interface, while leaving out details and parameters whose specification is common practice in the art. Likewise, in any other embodiment of the invention, the interface would usually be more completely specified. It will further be appreciated that incorporating the interface in any particular device or product entails specific physical and logical design, which may be done according to any prevailing technology and acceptable engineering practices and would be obvious to practitioners of the art.

FIG. 1 depicts schematically, in a block diagram, the physical and logical relationship between the main die 100, the flash-memory die 80 and the package (not shown). The two dies are interconnected through a multi-conductor bus 90, which thus constitutes a communication link between them. The purpose of the bus, and, more generally, of the communication link, is to enable exchange of data between the two dies, that is—to enable sending data from the MD to the FD, primarily to be stored in memory arrays therein, and receiving by the MD data from the FD, which is primarily data read from memory arrays therein. Data exchanged with any memory array will be termed 'memory contents data'. The exchanged data are transmitted over the bus according to a protocol, specified as part of the interface, by means of synchronous digital signals, whose characteristics are also specified as part of the interface. Flow of the data-carrying signals through the bus, and hence also operation of the FD, is controlled by means of a pair of Interface Controllers—one 110 on the MD 100 and one 10 on the FD 80, which intercommunicate over the bus, by means of control signals to be described below. Interface Controller 10 on the FD serves, inter alia, to control operations of data transfer (reading or programming) between memory arrays 70 and the bus 90. Interface Controller 110 on the MD communicates (as shown schematically in FIG. 4B), through an internal bus, with other modules on the MD. The latter are various hardware- and software components, usually present in such a device, which need access to the memory device for exchanging data therewith.

The Interface Controllers and their functions will be described in greater detail below; it will however be appreciated that the architecture represented here is by way of illustration only and that other architectures and components could be employed to carry out the principles of the invention.

It is also noted that the MD, the FD and their combination, as disclosed herein, may be regarded, each, as an embodiment of the invention.

Figure 2:
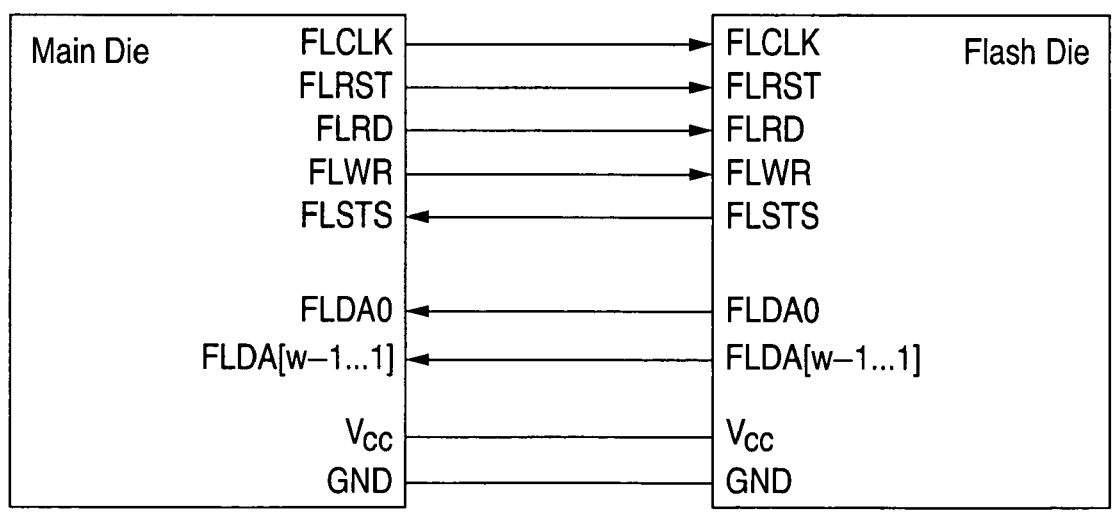
FIG. 2 is a schematic diagram of the signals flowing through the interface of FIG. 1.

In the exemplary embodiments of the invention, the bus 90 that interconnects the MD and the FD includes a minimum of six signal-carrying lines, depicted in FIG. 2. The first line carries a clock signal from the MD to the FD; the next four lines, termed signal lines, carry binary control signals, the first three of which flow from the MD to the FD and the other one—from the FD to the MD; the sixth line and any additional lines, termed data lines, carry data signals, which may flow in either direction. It will be appreciated that in other embodiments of the invention, more or fewer lines may be employed, possibly carrying different signals. Generally there may be more than one data line, as will be explained below. The six signals, in the order shown in FIG. 2, are briefly described in what follows and their functions will also be explained in various contexts further below. Other lines connecting the devices, such as the two shown in FIG. 2, carry supply voltages, although, in general, supply voltages may also be fed to the FD directly from outside the package, through externally connecting pads.

Flash Interface Clock (FLCLK): Serves as timing reference for all signals transmitted over the bus, whereby communication over the interface is based on a synchronous protocol. In some embodiments, FLCLK may serve also for timing internal operations in the FD (e.g. read or program operations); this may be particularly useful if the FD has no timing source of its own.

Flash Reset Signal (FLRST): This is an optional signal, generated by the MD and used by the flash device in the case that it does not have an internal power-up or brownout reset circuit.

Flash Interface Read (FLRD): Indicates a current read operation, i.e. data transfer from the FD to the MD. The source of the data actually read may be flash memory cells or status registers and depends on the flash command currently in effect, as explained below.

Flash Interface Write (FLWR): Indicates a write operation, i.e. data transfer from the MD to the FD. The target of the data actually written may be flash memory cells (in which case the operation is sometimes referred to as programming) or control registers and depends on the flash command currently in effect, as explained below. It is noted that all flash transactions start with a command, which is a write operation; thus the FLWR signal is also used for waking up the device from a low power mode. When multiple flash devices are deployed with the same interface, there may be a separate FLWR line connecting to each FD and any FD may then be selected by a FLWR signal on the corresponding line; alternatively, a particular device may be selected via a 'device select' signal on a respective one of a plurality of dedicated additional lines in the bus, or a device identification field may be defined in the command structure—all in a manner known in the art; this subject is not further discussed in the current specification.

Flash Interface Status (FLSTS): Generated by the FD to indicate current status according to context (i.e. current operational phase, to be explained below). During a data transfer phase it indicates "ready/not ready" and this is used to synchronize data transmission over the bus to the timing of corresponding operations within the FD in the face of a wide range of possible values for the ratio between the inherent data transmission rate on the bus and the inherent rates of operation in the FD. As will be further explained below, such synchronization is achieved by stalling data transfer over the bus as long as the signal indicates "not ready"; the signal turns to "ready" only when the internal operation has been completed and the last read data is available for transmission or a buffer is available for storing data to be written into memory. It is noted that the inherent data transmission rate on the bus is proportional to the product of clock rate (which is usually a function of the internal rate of the MD and of the electrical bandwidth of the bus) and the bus width (i.e. the number of active data lines); therefore the use of the FLSTS signal provides control of the data flow over the bus so as to compensate for variations in its effective rate and adjust it to the effective rate of the flash internal operations, which depends on flash parameters, such as array reading access time, array width (i.e. word length), programming time, etc. It is further noted that, while with prior art interfaces the main device must generally be configured to the parameters of the memory device and each of its arrays, so as to properly time data exchanges, the FLSTS in the exemplary interface of the present invention allows data exchanges to be carried out with memories and arrays having various parameters, without the MD being apriori configured to these or other parameters; this is a feature of the interface according to the second aspect of the invention. During a command phase the FLSTS signal indicates "error/no-error", which may be used to safeguard against erroneous operations; examples of such errors include invalid address, invalid command code, a non existing address buffer or an erase request when not enabled.

Each of the five signals above is carried on a single dedicated line. The term line means here an electrically conductive path, which may include a connecting wire and, on each device, a connection pad, a pin and/or one or more conductors. One or more further lines serve for data signals, to be described next.

Flash Interface Data signals (FLDA): Carry, each, data either from the FD to the MD or from the MD to the FD, depending on the current FLRD and FLWR signals. When not carrying data signals, a data line is in a high impedance state, denoted by HiZ; in order to avoid a floating line, it may be pulled by a resistor in the driver circuit to either a high- or a low default state, or, alternatively, blocked (i.e. leakage free) gates may be utilized.

A particular bus may have any one of a plurality of values for the number of data lines, the possible values in the exemplary interface being 1, 2, 4, 8, 16 and 32; this number is referred to as the physical bus width, w. As seen in FIG. 2, the lines are designated, in order, from 0 to w−1. It is noted that the maximum possible value of w, 32, also referred to as the range of w, is characteristic of the exemplary embodiment of the interface and may be different in other embodiments; moreover, for any particular application of a given interface, the range of w may be further restricted to the smaller of the physical bus width of the main device and the physical bus width of the memory device. The freedom of choosing a physical bus width from a plurality of possible values, within a given range (unless the range were 1), is a feature of the exemplary interface according to the first aspect of the invention.

Moreover, the number of lines to actually carry data signals at any given time, which number is referred to as the logical bus width, may be smaller than the physical width, w, and is dynamically configurable—for example, to $2^n$ (n=0, 1, 2 ...), up to w. Such configurability of logical bus width is another feature of the exemplary interface according to the first aspect of the invention. The possible values of the logical bus width are restricted to those supported by both the MD and the FD; the values supported by the FD are communicated to the MD by means of a field in a Device Capabilities Register (described below). Suitable commands, as explained below, may be used to configure the bus to a desired logical width.

A single data line, namely FLDA0, serves for transmitting certain control- and status data and this is the one that is also initially used for all data transfers, e.g. after reset, until the bus is re-configured to the desired logical width. For this reason, a single data line is considered in the exemplary embodiment to be the default logical bus width. It will be appreciated that, in general, the possible range for physical bus widths in any particular embodiment of the invention may also be greater than 32, or, conversely, also smaller than 32—even down to 1 (which would clearly limit the choice of w for any device to just 1). It will be likewise appreciated that, in any embodiment of the invention, the possible values of w may also be other than $2^n$, that, in any embodiment of the invention, the logical bus width may be configured to values also other than $2^n$ and that the default logical bus width may also be other than 1.

Transmission of data over the active data lines, as a group, is structured as sequential transactions, each beginning with a command. In the exemplary interface, each transaction consists of up to three consecutive phases—a command phase, during which a command byte is transmitted from the MD to the FD, an address phase, during which, for certain types of transactions, an address is transmitted from the MD to the FD, and a data phase, during which a burst of data bytes (of any length) is transmitted in either direction, depending on the command. Each phase may span one or more clock cycles, with pause- and turnaround cycles possibly applied as separations between phases. Transmission over the bus may thus be characterized as carried out by digital signals flowing selectably in either direction and carrying, in at least one of the directions (namely from the MD to the FD), commands, addresses and data in a sequentially intermixed manner.

The structure of commands will be further explained below. Data transmitted from the FD to the MD may be either status data, read from an interface register (such as discussed below), or memory contents data, read from a memory array. Data transmitted from the MD to the FD may be either control data, to be written into an interface register, or memory contents data, to be written into a memory array.

As explained above, the physical bus width of the exemplary interface, i.e. the number of data lines between the MD and the FD, may, in the exemplary embodiment, be any of $2^n$, where n is between 0 and 5; the logical bus width, i.e. the number of those data lines that actually carry data signals, may be configured to be $2^n$ (n=0, 1, 2 ...) up to the physical width. Whatever the current logical bus width is, commands and their various components (or phases) are sent over the entirety of active data lines as a group; thus, for example, if there are four active data lines, any particular byte of data would be transmitted over two clock cycle, during each of which each line carries one bit of data (for a total of four bits in each clock cycle). It is noted that therefore, at any instant, all data lines carry a transmission, if any, either from the MD to the FD or vice versa, from the FD to the MD, and, furthermore, all such line transmissions are, at that instant, in one or the other of the phases outlined above or, else, inactive (i.e. in HiZ state). Such alternatingly bi-directional transmission of data signals over each active line of the bus, carrying data intermixed with commands and addresses, is yet another feature of the exemplary interface according to the first aspect of the invention; a further feature is that the total amount of memory contents data transmitted over the bus during any one transaction does not depend on the active bus width and is, for example, solely a function of the application program initiating the transaction; according to the latter feature, a transaction is usually completed when the amount of data specified by the application program has been transmitted, regardless of the amount of time that this may take; such time is, often, nearly inversely proportional to the bus width, though it also depends on parameters of the implemented FD or of any memory array within it, including reading- and programming speed and its interface bandwidth, the latter, in effect, limiting the bus clock rate.

As noted above, all signals transmitted through the bus are synchronized to the clock signal, FLCLK. Such synchronization is effected by means known in the art for digital systems, whereby relative time ranges are specified for signal parameters, such as set up, validity and holding, as well as rising- and falling edges. For the case that the FD does not have an internal timing source, there is provided a circuit on the exemplary embodiment of the FD for generating its required timing signals from FLCLK, to be explained below; this is a feature of the exemplary interface according to the fifth aspect of the invention. Also as noted above, since there must generally be a provision for resetting the FD, e.g. upon power up or after a power failure, if the FD does not have an internal operational circuit for detecting power-up and power-down conditions, the FLRST signal may be used for the purpose.

Addressing of memory locations in the flash die is done across the interface based on a standard address space, each address pointing to, say, a byte of data. In the illustrative embodiment, an address consists of 24 bits and thus the size of the address space, and therefore also the maximum total size of an addressable block in the memory, is 16 megabytes; it will be appreciated that in other embodiments of this invention, the address length, and therefore also the size of the address space, may be different. This standard address space is used to uniquely map into it the internal addresses of the particular flash memory device, in whatever structure its design may assume, as discussed in what follows, and includes, significantly, the possibility of multiple arrays; if the width of any array (i.e. physical word length) is greater than one byte, the mapping is to byte-size segments of each word.

Figure 4A:
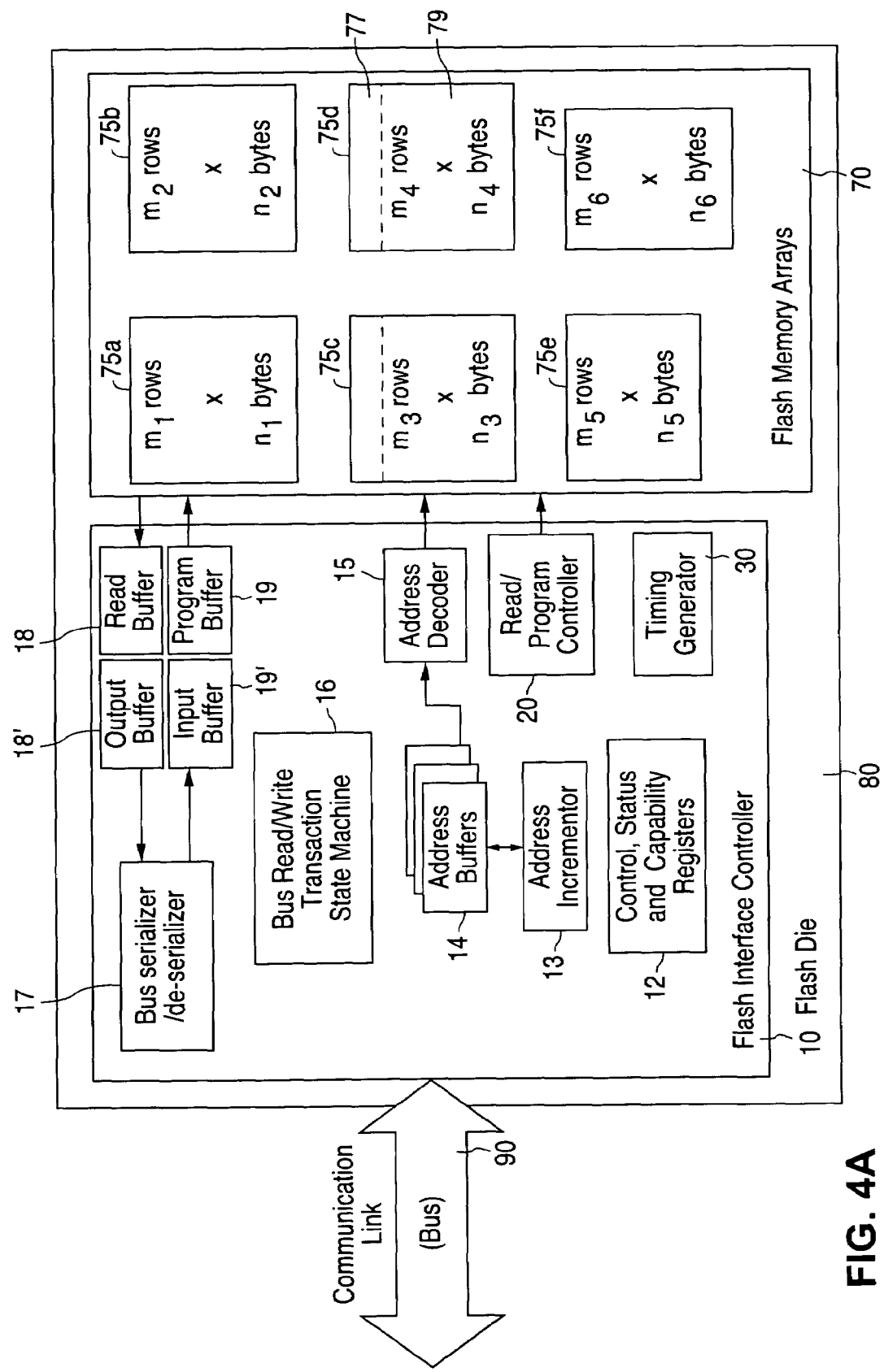
FIGS. 4A and 4B are schematic block diagrams showing relevant components of the embodiment of FIG. 1, as included in the flash die and the main die, respectively.

As noted, some types of flash devices have a plurality of arrays, which, moreover, may have different characteristics. These characteristics include, inter alia, length, in rows (i.e. words), and width, in bytes (the latter also referred to as the physical word length); their product is the overall size (in bytes) of the array. FIG. 4A illustrates this by showing six exemplary arrays 75a-75f, within flash memory 70. It is seen that the length, m, and width, n, may vary among the arrays; in particular, array 75e is shorter, and array 75f is narrower, than the others.

More generally, in the context of the present invention, array characteristics are grouped into two groups: One group consists of array parameters that affect the rate at which data may be read from, or programmed into the array, which will be referred to as parameters. These depend on memory type. For a flash memory they include memory access time, data reading time, data programming time, erasing time and the aforementioned array width; each of them may have a range of possible values. Their role in the process of data transmission by means of the interface disclosed herein is discussed further below. The other group of array characteristics, referred to collectively as the array's structure, includes overall size (or, briefly, size) of the array and the size of each page in the array; it may be noted that a page is the smallest group of memory locations that may be erased, i.e. set to their blank state (commonly being '1' in flash devices), in a single operation and that there usually are a plurality of pages in an array. Moreover, any array may be divided into a main block (MB) and an information block (IB); the MB serves for storing "payload" data, namely data provided or required by any module or application in the MD during the course of its normal operation; the IB is intended mainly for storing auxiliary data occasionally used by the MD or application programs (such as parameters and control- or configuration data, pertaining to the section or to its contents), as well as system parameters, set at manufacturing time; in some cases it may be used by the FD itself (e.g., for storing error locations or contents locking defaults). The information block is generally much smaller than the main block and usually consists of a single page, whereas the main block usually consists of a plurality of pages. In the exemplary illustration in FIG. 4A, arrays 75c and 75d have information blocks, as denoted by the dashed horizontal lines. The existence and, if so, size of an IB within an array is another component of its structure; the IB size may be expressed as a fraction of the overall size and a value of zero indicates absence of an IB in the array.

In the exemplary embodiment, all the arrays are logically grouped into one or more sections, each section consisting of one or more arrays; if more than one, all arrays of any one section have identical structure, that is—they are identical in overall size, page size and the size of the IB, if any; clearly, if there is a single array, there will also be a single section. Moreover, the main blocks of all arrays (including whole arrays that lack an IB) are logically grouped into a logical Main Block and the information blocks of all arrays (where present) are logically grouped into a logical Information Block.

Figure 3:
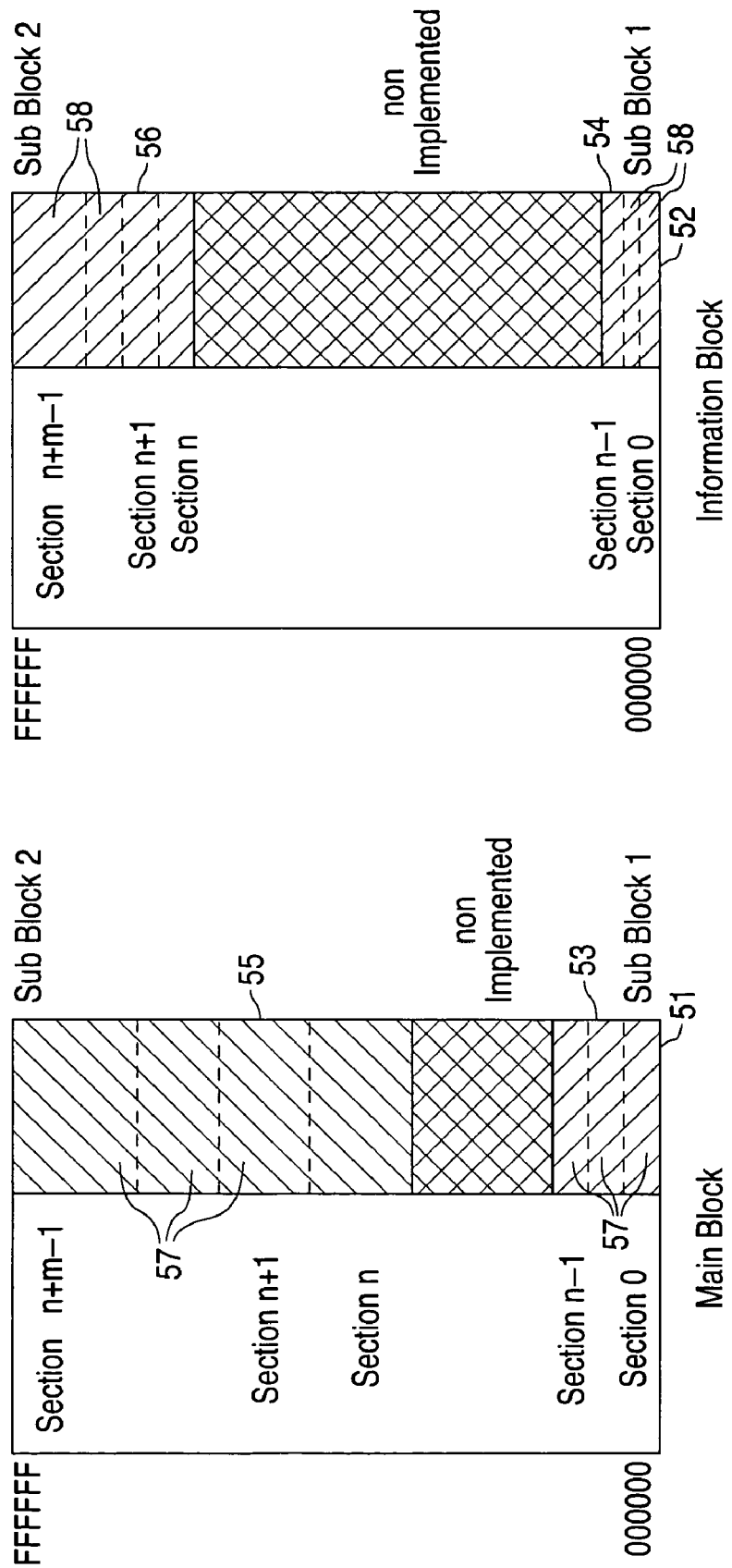
FIG. 3 is a schematic diagram of the memory address structure underlying the interface of FIG. 1.

The address mapping is generally structured accordingly, as depicted schematically in FIG. 3, whereby each of the two logical blocks—Main Block (MB) 51 and Information Block (IB) 52—is mapped into a standard address space. The address space of each block is dividable into a plurality of sections—57 and 58, respectively, to correspond to the logical sections into which arrays are grouped. Each section may be regarded as consisting of a portion that is part of the Main Block (MB) and a portion that is part of the Information Block (IB). The maximum possible number of sections supported by the illustrative embodiment is eight (though it may generally be any number, smaller or greater). The addresses within any one section of the address space, i.e. those mapped to the MB portion or the IB portion of a corresponding section of the memory device, are mutually consecutive. Likewise, whole sections within each block are mutually consecutive in the order of their designations, except that they may be separated into two sub-blocks of n and m sections, respectively. In sub-block 1-53 and 54—sequential addresses ascend, beginning at the low end of the address range, i.e. at value 000000. In sub-block 2-55 and 56—sequential addresses descend, beginning at the high end of the address range, e.g. at value FFFFFF. The numbers n and m are selectable and any one of them may be 0. This division, which is not dictated by any inherent structure of the memory, is useful at times for access to the flash memory by two different and independent applications; as an example, in the case of the PC87591 device by National Semiconductors, a shared BIOS architecture is used with a dual similar mapping scheme, whereby one part of the device (i.e., host BIOS code storage) uses the high address range and the other part of the device (i.e., EC core code) uses the low address range. As may be observed in FIG. 3, the range of mapped addresses within each sub-block is considerably different between the two blocks, because of the usually much smaller relative size of the Information Block part (which may even be zero in some sections). Clearly, if there is a single section, there will be only one sub-block.

It is noted that if the total number of addresses (i.e. the sum of the number of addresses in all the sections) is smaller than the address space (e.g. 16M), which is the usual situation, depicted in FIG. 3, addresses outside the defined ranges (i.e. between the two sub-blocks) are not mapped, as marked in FIG. 3, and are considered illegal and therefore are ignored, return a fixed value (e.g., a value of zero) or may return an error; thus no alias addresses are allowed. Since any array mapping is done based on full address decoding to any single location in the memory map, aliasing of memory locations within the FD is thus prevented—which constitutes a safety measure for security applications and other programs that apply access control policies. The sequential non-overlapping mapping of addresses, as avoiding aliases and thus promoting data safety, in face of any memory structure by sections or multiple arrays, as well as by various word widths, is a feature of the exemplary embodiment according to the second aspect of the invention; another feature is the division of the address space into upper and lower sub-blocks.

The Main blocks (MB) and Information blocks (IB) are mapped and addressed separately, though they have identical address space (000000 to FFFFFF). Accordingly, an address in the exemplary embodiment of the interface may be mapped to point to a memory location in either the main block or the information block of any section, depending on which address buffer is specified in the command (as explained further below); in the illustrative embodiment, addresses directed to an information block appear in address buffer 15.

The mapping structure described above, while mainly pertaining to MB addresses, is retained also with respect to IB addresses, whereby IB addresses corresponding to all sections within each of the two sub-blocks are contiguous, starting with 000000 and FFFFFF, respectively. As already noted, because of the relatively small size of the IB, IB addresses will generally occupy only a small fraction of the address space.

Also as noted, differentiation between MB and IB locations is done by means of identifying the address buffer (which is part of the command code), rather than by an extra bit in the address or by additional commands, as is done in prior art. Erase operations in the information block are effected by dedicated commands, distinct from those effecting erasure in the main block, as is shown below.

Some of the characteristics of each section 57, listed above, namely overall size (in the main block) and page size, as well as its size (including 0) in the information block and its assignment to a sub-block, are stored in a corresponding Section Capabilities Register (see below) and are thus made readily available to the main device; this enables programming in the main device to be easily adaptable to various types of memory devices—even those not apriori listed. It is noted that transaction protocols according to the invention obviate communicating other array characteristics, namely those defined above as parameters (such as word length, reading access time and programming- and erasing time, which parameters may vary among arrays) to the MD, since data flow will be automatically paced by the rate of operation within the memory arrays, through the use of the Ready signal during Read- or Write operations and the attendant bus stalling mechanism (all as described below). The adaptability to various device characteristics, as described hereabove, is a significant feature of the exemplary interface according to the second aspect of the invention; additional features are the various means, discussed above, for achieving such adaptability, namely the Section Capabilities Register and the data flow protocol (as well as the address mapping scheme, mentioned above).

FIG. 4A shows schematically relevant components of the interface that are present on the exemplary embodiment of the interface in the memory device—all logically included in the Flash Die Interface Controller 10 (also shown in FIG. 1)—to carry out some of the functions described herein. These include, in particular, various buffers and registers to be described in what follows. Data signals received over the bus 90 are assembled into complete bytes in Bus Serializer/Deserializer module 17, which also converts bytes into data signals to be transmitted over the bus to the MD. Bus Read/Write Transaction State Machine 16 manages all transactions transmitted over the bus, including decoding of commands.

A pair of data buffers serve to mediate between the data transmitted over the bus and the memory reading- and programming mechanism. One of them is a Read Buffer 18, serving to obtain one or more complete bytes, read from memory, and feed them (through module 17) into the data line, as regulated by the data flow mechanism (explained below). The other one is a Program Buffer 19, serving to collect one or more complete bytes of data received over the bus, making them available to be programmed into memory. The Program Buffer 19 also serves for comparing the programmed data (obtained from memory during a verification cycle) with the received data. Operation of the data buffers is discussed below. Read Buffer 18 may be configured as a double buffer, by adding to it an output buffer 18'; this enables reading from memory one chunk of data (into Read Buffer 18) while sending over the bus (from the output Buffer 18') a previously read chunk. Likewise, the Program Buffer 19 may be configured as a double buffer, by adding to it an input buffer 19'; this enables programming into memory one chunk of data (from Program buffer 19) while receiving over the bus (into Input Buffer 19') a subsequent chunk.

There is at least one address buffer 14 for directing any data reading- or programming operation out of, or into, the memory. Since data reading or programming is usually carried out in blocks or bursts (each block or burst containing a plurality of data bytes, to be stored in sequentially increasing address locations), one block per transaction, the address of the first byte of a block is transmitted over the bus from the MD, within the command that initiates the corresponding transaction (as outlined below), and written into the address buffer. Thereafter, the address in the buffer is automatically incremented, by means of Address Incrementor 13, to read or program successive bytes in the memory. The address, as current in the address buffer, is translated, by means of Address Decoder 15, into the identity of an appropriate array 75 and an internal address within that array, which address is then passed on to the array. When a large block of contiguously stored data needs to be read from memory, or programmed into memory, it may be done by a series of consecutive transactions, referred to as a stream. A stream may also be formed when the MD generates a series of transactions, not necessarily consecutively in time but addressed to consecutive segments in memory. In such a case, the first transaction of the stream is effected by a regular Read- or Program command, as described above. Subsequent transactions, for continuing the stream, are done by means of Read-Continue- or Program-Continue commands (to be described below), in which there is no address transmitted; during operation, the first address of each such transaction is taken from the address buffer 14 after incrementation and is thus the one just following the address of the last byte of the previous transaction in the stream. Since the Read-Continue and program-Continue processes assume that both the MD and the FD are aware of the current state of the address buffer (though no address is passed through the bus) there is also on the main die 100, as part of its Interface Controller 110, an address buffer 114 and an Address Incrementor 113; the address buffers on the two dies are mutually coordinated by both being incremented for each byte that is fully transferred to or from memory, ignoring (truncating) any partially transferred byte.

In some configurations of the exemplary interface, according to the fourth aspect of the invention, there are on the FD (and on the MD) more address buffers 14 (114) than one. In such a case, successive transactions use the several buffers alternatingly. This is useful for reading and/or programming several streams of data blocks simultaneously, interleaved in a time, wherein, again, Read Continue or Program Continue commands, respectively, are used for each stream. Typically, upon obtaining a first Read command, its conveyed address is stored in a first address buffer, named by the command, and read operation proceeds as described above; a subsequent Read- or Program command, naming a second address buffer, results in its conveyed address being stored in that buffer and the prescribed operation proceeds following the conclusion of the first operation; a subsequent Read Continue command, which is directed at the first address buffer (but, as explained above, does not convey any explicit address), results in resumption of the first operation, beginning with the incrementation of the last stored address in the corresponding (first) buffer. This cycle may repeat indefinitely, wherein also the second operation may be resumed by a Read Continue or Program Continue command. Clearly, this feature may be extended to more than two streams, by providing commensurately more address buffers. Such support for multi-stream operation is a feature of the exemplary interface, according to the fourth aspect of the invention.

Figure 6:
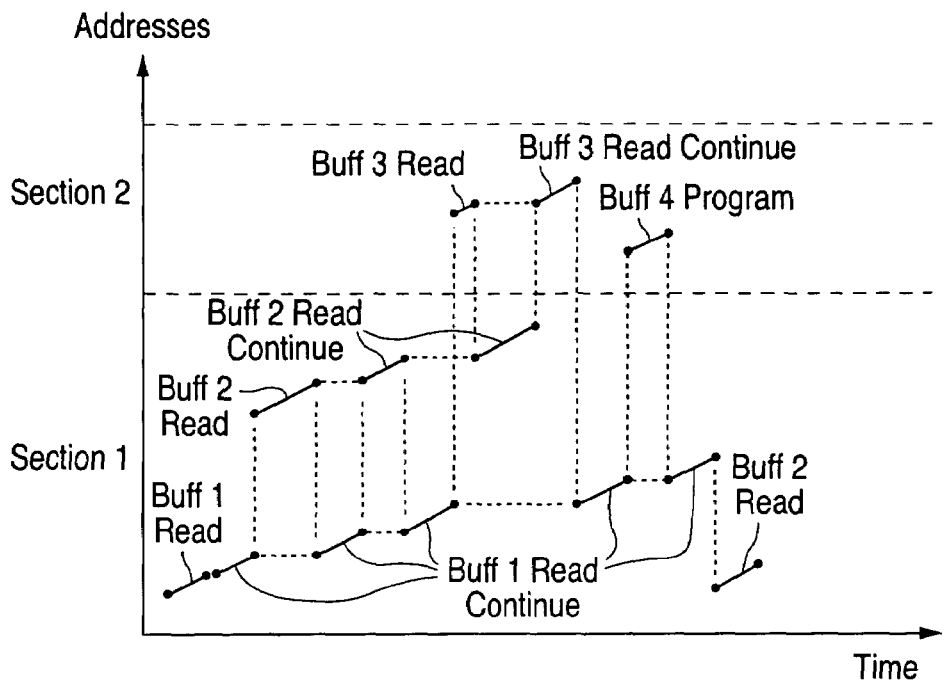
FIG. 6 is a schematic diagram, illustrating reading and programming multiple streams of data in the memory device of FIG. 1.

The effect of an exemplary multi-stream operation is illustrated in FIG. 6, which depicts schematically a plurality of read bursts and one program burst along a time scale. Each burst is represented by a short inclined line, extending vertically over the range of consecutive addresses it involves and horizontally—over the time of its execution; each such line is marked by a command that initiated the burst, and by an address buffer with which it is associated, denoted by 'buff 1', 'buff 2', etc. The bursts are seen graphically to form several streams, each stream associated with the same particular address buffer. The first burst of each stream is initiated by a Read command or (in the case of the burst marked 'Buff 4')—by a Program command; the succeeding bursts in a stream, if any, are initiated each by a Read Continue command. It will be observed that each successive line in a stream starts at an address just above the last address of the preceding burst, even though there is generally a horizontal gap between successive lines, representing time gaps between successive bursts. Such time gaps are seen to jibe with bursts in other streams, thus illustrating the aforementioned interleaving of the streams. The temporal sequence of bursts in the illustrated example is thus as follows: Two consecutive bursts associated with buffer 1; a burst associated with buffer 2; . . . buffer 1; . . . buffer 2; . . . buffer 1; . . . buffer 3; . . . buffer 2; etc. In the present example, the Program burst associated with buffer 4 is not extended into a stream. The last burst in this example is associated with buffer 2, though it does not belong to the stream earlier associated with buffer 2, since their addresses are mutually disjoint; this illustrates a re-use of buffer 2 in the case that only four address buffers are available (based on a LRU scheme), as discussed below. It is pointed out that the addresses illustrated in the present example extend over two sections, as marked.

It is noted that in the exemplary embodiment only one stream of program transactions may be carried out in such simultaneity with other transactions (which are then necessarily Read transactions); multiple streams of program transactions would be possible if there were provided a commensurate number of additional Program Buffers 19 and of control and status bits (e.g. Ready bit fields in the Status and Control Register of FIG. 5A—to be explained below).

Figure 4B:
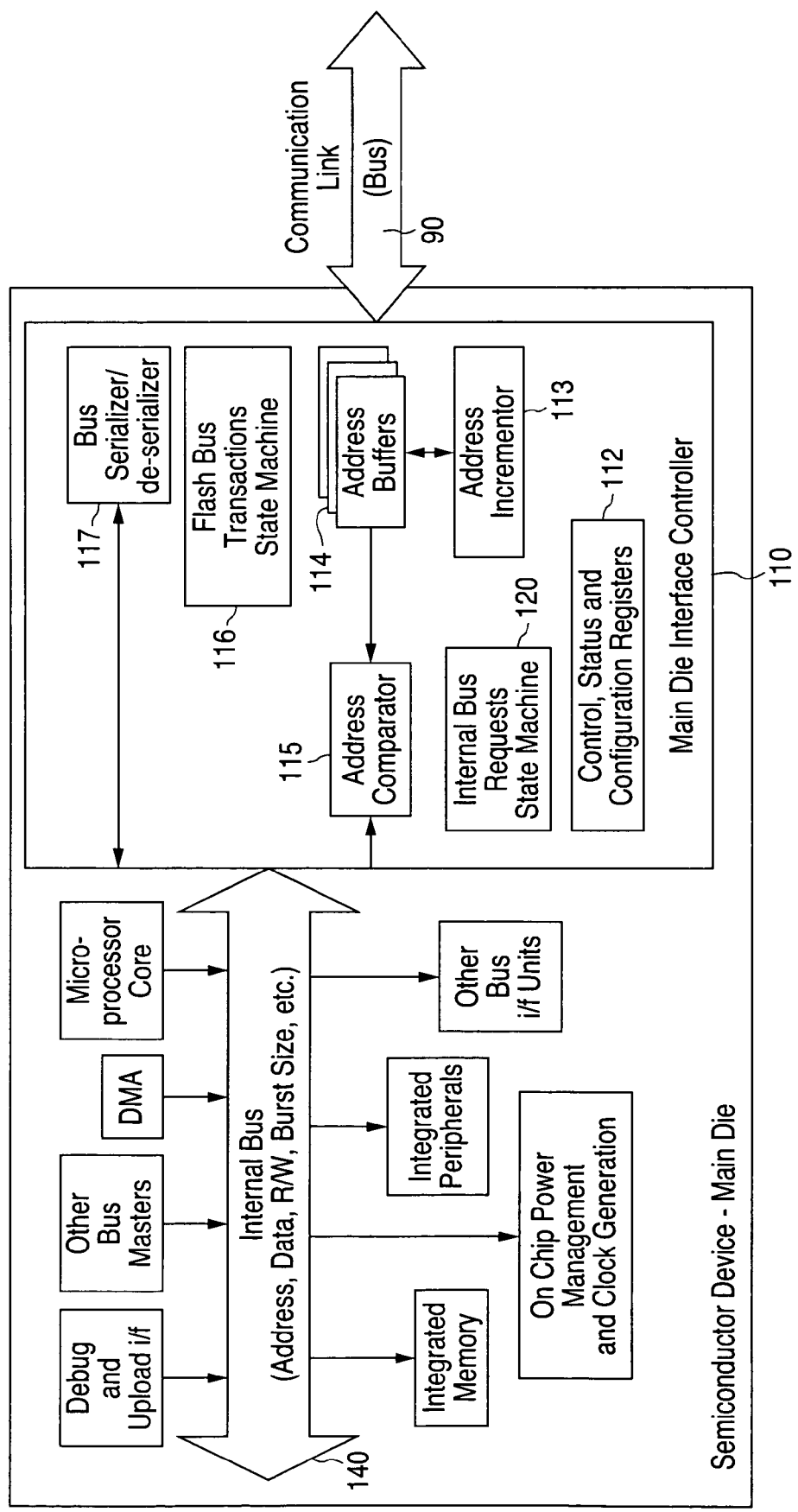

Turning to FIG. 4B, it is seen that in the exemplary embodiment of the Interface Controller 110 on the MD 100, there is provided an Address Comparator 115. This may serve to free any application program on the MD from the need to track streams and to issue Read- or Program Continue instructions accordingly. Instead, each application provides a start address for each burst it requests, as is the normal practice; Address Comparator 115 compares each such address with addresses currently stored in address buffers 114; if there is a match, it issues an appropriate 'continue' command that names the matched buffer. If the address does not match any currently active buffer, it signifies a new stream request and another, inactive, address buffer is selected and assigned to the stream and an appropriate Read- or Program command is issued, naming that buffer. In the exemplary embodiment the maximum number of address buffers (on each die) is 16 (including the one for the information block), as proscribed by the corresponding 4-bits field in the command code (see below); generally, however, more address buffers are possible—for example, with different command structures. It is noted that the number of streams that may be run may practically be greater than the number of address buffers, by assigning buffers to the various streams dynamically, possibly according to statistics of their usage. There are various schemes for assigning address buffers to various streams, including LRU (re-assigning least recently used), random, pre-allocation to various operations and combination of these.

As seen in FIG. 4A, there are several registers on the exemplary embodiment of the memory device, collectively referred to as Control, Status and Capabilities Registers 12, which are required for appropriate functioning of the interface. These may, in some embodiments, be echoed on the MD by a similar group of registers 112 (FIG. 4B); similar registers on both dies may be kept mutually coordinated by means of appropriate register reading and -writing commands. alternatively, the MD may keep copies of the contents of the FD registers 12 in certain locations in its own memory, to be updated periodically or according to a pre-defined scheme, by means of regular register reading and -writing commands.

The various fields in each of the registers will now be described with reference to respective structure tables in FIGS. 5A-5F. The fields are listed in the order of their respective bit positions, starting with the least significant bit (bit 0). Commands mentioned in the explanations are discussed further below.

Device Status and Control Register (FIG. 5A) is a read/write register that provides miscellaneous status and control information, as follows:

"Ready": Indicates whether the memory device is ready or still busy with a Program- or Erase operation. This bit, may be read out repeatedly, to provide continuous monitoring of the status of these operations, so that when an operation ends, this information may be conveyed to the MD with very short latency (beyond the overhead involved in starting the repeated monitoring by a register read command); usually such latency is of one clock cycle.

"Double Buffer Empty": Indicates, during Program and Program continue operations, that the Input buffer (of a double Program Buffer, if provided) is empty and that data up to the buffer size can be safely written to it without the risk of the bus becoming stalled (as illustrated in the timing diagram of FIG. 8D, to be explained below). This provides the capability to utilize the double buffer arrangement (which, in any case, allows initiating a Program transaction while a previous one is still executing) to transmit a buffer-full of program data at full bus speed. It is noted that this capability is useful but not critical for interface operation, since the specified mechanism of bus stalling when FLSTS signal indicates 'Not Ready' would otherwise regulate the data flow.

"Program Error": Indicates an error condition, during the last program operation, which was detected during a Program Verify phase (if requested). Note that a write error is a failure of any bit to change from '1' to '0'.

"Protection Error": Indicates that an erase- or write operation was aborted, owing to violation of program protect conditions.

"Erase Error": Indicates an error condition during the last erase operation.

"Clock Frequency": Conveys to the FD the value of the frequency of the clock signal (FLCLK) sent from the MD over the bus and used by some configurations of the FD for timing internal memory access operations, such as reading, programming and erasing, in case the FD does not have a timing source of its own; The frequency value is to be translated into corresponding parameters governing the conversion of the clock signal to internal timing signals (as explained below). Note that conveyance of the clock frequency value and its use for generating internal timing in the FD are features of the exemplary interface according to the fifth aspect of the invention.

Flash Device Capabilities Register (FIG. 5B) is a read-only register, of double-word length, that provides to the MD (upon the corresponding Read command—see below) information on the capabilities and properties of the particular flash device. This information can be used for appropriately configuring the interface and some of the commands sent from the MD.

"Bus Widths Support": Conveys the logical bus width values that the particular FD supports; each bit indicates a particular supported value, namely, in the exemplary embodiment—2, 4, 8, 16 and 32, respectively. Note that the support of the default bus width (as defined, which, in the exemplary embodiment, is 1) is always assumed, in addition to those indicated. Note also that in the exemplary embodiment, the 5-bits field shown here can indicate up to five bus-width values; however, a greater number of values may be possible, by expanding the field.

"Read While Program": Indicates whether the FD is capable of supporting simultaneous Read- and Program operations (i.e., reading to one location while programming to, or erasing, another location). As indicated by the field value, this property may be limited (in the particular FD) to reading and programming in different sub-blocks, in different sections or in different arrays. If capable, such an operational mode is enabled via the flash control register.

"Number of Address Buffers": This field conveys the number of address buffers available in the flash device for accessing the Main Block (used for multiple streams operation, as explained above). If the device has an Information Block, there is one additional address buffer associated with it.

"Program Buffer Size": This field conveys the length of the data buffer in the flash device, used for programming operations. This information may be used by the MD to limit length of data bursts in flash program commands so as to avoid bus stalling. Note, however, that in case any data, in a program command are sent while Program Buffer is full, they will not be lost, as the FLSTS signal will be used to extend the command (while stalling the bus) until buffer space is available.

"Double Program Buffer": Indicates the availability of an Input Buffer 19' (FIG. 4A) in front of the Program Buffer 19, forming together a double buffer. When a double buffer is thus available, Program- or Program Continue commands may be sent while a previously initiated program operation in the FD is still under way; this may reduce overall time for finishing a flash programming task. In this case, the value of "Program Buffer Size" and its usage for preventing bus stalling (as explained hereabove) pertain to the Input Buffer.

"Self Timed Flash": Indicates whether the flash device is self timed or requires the FLCLK for generating its timing signals during read, program and erase operations (as explained below). Note that if not required (i.e., if the flash is self-timed), FLCLK may be discontinued except during flow of commands or data over the bus, to preserve power.

"Number of Sections Sub-Block 1", "Number of Sections Sub-Block 2": These fields convey the number of sections in Sub-Block 1 and in Sub-Block 2, respectively, that are mapped into the lower and upper portions, respectively, of the Interface's address space. Note that some of the sections may include both MB and IB portions, and some may contain only MB portions.

It will be appreciated that in other embodiments of the invention, device capabilities may be reported also in formats different from the above and that also other properties may thus be reported, especially as relating to different memory technologies (such as SRAM).

Section Properties Register 'i' (FIG. 5C) is a read-only register, of double-word length, that provides to the MD (by means of the Section Properties Read command) information on structural properties of Section 'i' of the flash device. There is one such register for each of the sections in the device (whose maximum number in the illustrative embodiment is eight, but may generally be any). This information can be used for configuring the MD usage of the FD memory.

"Main Block Size": Conveys the size of the main block portion of the section, in terms of number of pages.

"Page Size Block 1": Conveys the size of a page in the Main Block of the section. A page is the minimal segment of a flash array erasable upon a single erase command. It may be noted that for flash memories, programming of data can be done also to units smaller than a page (typically—width of the array) by masking all bits that are to remain unchanged with 1's and relying on the property that bits in the flash memory can change during programming only from 1 to 0.

"Information Block Size": Conveys the size (including null size, i.e. absence) of the Information block portion in the section, as fraction of the size of the corresponding Main block portion in this section.

"Sub Block": Indicates to which of the two Sub-Blocks (lower or upper) the section belongs.

It is noted that, based on the information provided by all the Section Properties Registers, the MD can construct internally a map of the FD memory, including information on the sizes of the sections and of the erasable units within them. It will be appreciated that in other embodiments of the invention, section properties may be reported also in formats different from the above and that also other properties may thus be reported, especially as relating to different memory technologies (such as SRAM).

Program Protect Control Register (FIG. 5D) is a read/write register, one byte long, that controls the ability to modify contents of the memory. It is used for protecting the device from accidental program- or erase commands, though it is not designed to protect the device against deliberate attacks on its contents. It is noted that some memory devices include specific data protection logic, such as read- and program protection over specific portions of the memory—possibly with lock mechanisms, which are possibly password protected. Such mechanisms can be supported in other embodiments of the invention—for example, by defining suitable commands or by providing a set of suitable registers that may be accessible via a specific address buffer.

"Program Enabled": Indicates that execution of program- and Program Continue commands is enabled.

"Page Erase Enabled", "Main Block Section Erase Enabled", "Information Block Section Erase Enabled", "Complete Section Erase Enabled", "Chip Erase Enabled": Indicates that execution of the corresponding command is enabled.

"Engineering Registers Access": Enables Read, Read Continue, Program and Program Continue commands that use address buffer 15 to access the Flash Engineering registers (see below), rather than the Information Block.

"Verify Enable": Enables execution of a Verify command at the end of a Program- or Erase command. Note that a Program command will be verified once for each Program Buffer full of data and that an Erase command will be verified after completing erasure of the corresponding unit (e.g. page or section). The verify operation may be automatically enabled by the FD as part of periodic program- and erase-retry operations that are applied to extend the product endurance.

Device Identification (ID) Register (FIG. 5E) is a read-only register that provides information about the device—its version, its manufacturer and the implemented interface specification version.

Interface Control Register (FIG. 5F) is a write-only register, which immediately affects the state of various components of the Flash Interface Controller. The MD will usually have a mechanism that writes to this register (by means of the appropriate Write command) as part of a system recovery process (such as watchdog event), as part of a debug process (reset by a debugger) or as a software initiated operation; the mechanism may involve a similar register in the mirror portion 112 of the interface on the MD.

"Reset": This bit causes the FD to reset, bringing all its registers and internal state machines to an initial state and potentially terminating any program and erase operation.

"Power Down": Sets the flash device to its power save mode. The FD will stay in this mode until receiving any other command.

"Interface Setting": Conveys the currently selected number of active data lines in the communication link (i.e. logical bus width). Note that after a reset, the logical bus width is set to its default value (which is 1 in the exemplary embodiment).

"Enable Read Parallel to Program": Enables execution of Read commands simultaneously with memory modification commands (i.e. Program, Erase Page, or Erase Section), if the FD has such capability.

Flash Engineering Registers are optional registers within any flash device, which may be used as backup, in case of a need to debug the device or to bypass bugs in it, or for testing operations. Such registers are not defined as part of the interface but are accessible by means of Read, Read Continue, Program and Write Continue commands through address buffer 15 (see above).

As described above, reading of data from memory and modifying contents of the memory (i.e. erasing and programming) are carried out as transactions, initiated by appropriate commands and affected by the contents of the specified registers. There is also another group of transactions and associated commands, which serve for reading and writing data from, and into, the registers themselves. All commands and associated data are transmitted across the interface over the data lines of the communication link (the bus). Such transmission proceeds according to a structure specified for each type of command.

Table 1 presents the byte-by-byte structure of all commands specified for the exemplary interface for bus-widths of up to 8. There is one byte transmitted during each successive cycle of bus operation; when BW=8, a bus cycle usually occurs during one clock cycle (unless there is a stall condition, during which the same byte extends over further clock cycles) and when BW is 4, 2 or 1, a bus cycle usually occurs during two, four or eight clock cycles, respectively (owing to serial transmission of corresponding nibbles or single bits; again, each of these cycles may be extended, owing to a stall condition). For bus-widths of 16, there are two bytes transmitted during each successive bus cycle and for bus-widths of 32 (FIG. 6C), there are four bytes transmitted during each successive bus cycle (wherein each bus cycle occurs during one clock cycle). The latter two cases are discussed below, with reference to Tables 2 and 3.

Each row in Table 1 represents a transaction type, specific to the command, and is structured in terms of bytes successively transmitted over the bus. The value of each byte is stated—either as a fixed number (in hexadecimal notation) or as a variable. In the tables there appears for each byte an additional column that indicates the direction of transmission over the bus during that byte; W means writing, i.e. transmission from the MD to the FD, while R means reading, i.e. transmission from the FD to the MD. To the clock cycles that carry the bytes listed in the tables for any transaction, there may be added a Turn-around (TAR) cycle or a Pause cycle, as explained below. Also as explained below, transmission timing is controlled by the Ready signal on the Status line (FLSTS) of the bus (FIG. 2)].

Tables 2 and 3 present the structure of commands for logical bus widths of 16 and 32, respectively, on hand of a few exemplary transaction types (for brevity). It may be seen that the byte-by-byte structure of any transaction type is similar to that in Table 1 and that the main difference lies in the grouping of bytes into successive bus cycles; in Table 2 every two successive bytes, and in Table 3 every four successive bytes, are grouped into a bus cycle; any bytes within a cycle are in the same direction (either R or W). The bus cycles, in each table, are marked at the top with their sequence numbers. The support of other logical bus widths, such as non-power-of-two values, may require some obvious changes to details of the described structure and the resultant operations.

As mentioned above, the bytes along each transaction may be grouped into up to three successive phases—Command Phase, Address Phase and Data Phase. Bytes in the first two phase types are transmitted in the W sense, whereas bytes in the Data Phase are transmitted in either direction, depending on the command type. The first phase of a transaction is always a Command Phase, consisting of a single byte that conveys the command code.

The first nine rows in each table list commands that involve memory data reading or modifying. In the command codes of the first four of these rows (pertaining to reading and writing), the letter 'n' denotes the numeric designation of the address buffer to be used (from $0_H$ to $F_H$) It is noted that the number of available address buffers may be read from the Flash Device Capabilities Register, that the readiness of any address buffer can be ascertained from the FLSTS signal during the command phase (where it serves as error indication) and that the address buffer designated $F_H$ (0xF in some engineering notation) always points to an Information block. Except for the Read Continue and Program Continue commands, the second to fourth bytes constitute the Address Phase and convey, after concatenation, the starting address of the relevant memory locations (which address is specified by a 24-bits number, corresponding to the address space of 16 M bytes). Subsequent bytes in the Read and Program commands, as well as all bytes following the first byte in the Read Continue and Program Continue commands, are in the Data Phase and carry data bytes, to be read from, or programmed into, as the case may be, consecutive memory locations; addressing of these locations is under control of the designated address buffer, which is incremented correspondingly. It is observed that data bytes in the two types of Read commands are marked in the tables by R, signifying their transmission direction from the FD to the MD, while data bytes in the two types of Program commands are marked in the tables by W, signifying their transmission direction from the MD to the FD. It is noted that the Data Phase continues, i.e., additional data are transmitted from or to the MD, as long as the FLRD or FLWR signals, respectively, are kept active by the MD.

The last five of the first nine rows list Erase commands that pertain to respective types of memory segments; they do not involve data exchange. "Chip Erase" effects erasure of the entire memory space on the die, while the other four Erase commands are directed to segments associated with the conveyed address. The execution of erase operations depends on pre-setting of erase-enable bits or other possible erase protection measures, as discussed above. It is noted that erasing in a flash memory is a prolonged process and that its status is flagged by the Ready bit in the Device Control and Status register. It is further noted that various erase commands include a parity code that prevents another command to be erroneously interpreted as an erase command owing to a run time error in one of the bits.

The next seven rows of each table list commands that involve registers, described above; the name of the register is generally implied by the name of the command.

"Device Capabilities Register Read": The command code is followed by the transmission of the full four bytes of data read out from the register.

"Section Capabilities Register Read": Bits 4-6 of the command code form the designation number of the particular section and its register (0-7); the command code is followed by the transmission of the full four bytes of data read out from that register.

"Device Status and Control Register Read": The command code is followed by the transmission of both bytes of data read out from the register.

"Device Ready Status Read": The command code is followed by the transmission of a single bit, namely bit 0 ("Ready") read from the Device Status and Control Register; as described above, this bit indicates whether any resetting, erasing or programming operation in the memory is in progress. The second cycle, i.e. the reading and transmission of the Ready bit, may be repeated for continuous monitoring. It is noted that such ability to continuously monitor the status of these operations is equivalent to the provision of a dedicated signal in interfaces of prior art and may similarly enable using a hardware component in the Interface Controller 110 of the MD (FIG. 4B) to perform such monitoring. The described mechanism for reading the Ready status also enables a low latency detection of the completion of any program or erase operation, regardless of the logical bus width used. "Device Status and Control Register Write": The command code is followed by the transmission of two fixed value bytes, followed, in turn, by the two data bytes to be written into the register. The two fixed value bytes serve as a check on the command code to prevent accidental alteration of a critical register or memory contents due to a single-bit error.

"Program Protect Control Register Read": The command code is followed by the transmission of the single data byte read out from the register.

"Program Protect Control Register Write": The command code is followed by the transmission of two fixed value bytes, followed, in turn, by the single data byte to be written into the register.

The last three rows list commands that are to be used rarely,—for example, during the setting up of the interface (which is part of the MD boot or error recovery process). They assume transmission in the default logical bandwidth (1 in the exemplary interface). It is noted that the value of bit '0' of the command code for these is 1, which allows identifying these commands in any of the bus configurations, thus being able to accept the command also over the default bus width. Two of the three commands involve, again, registers that share their names.

"ID Register Read": The command code is followed by the transmission of the full four bytes of data read out from the register.

"Enter Test Mode": Test Mode is defined for the purpose of failure analysis of the memory device. The command code is followed by the transmission of two fixed value bytes; no variable (data) bytes are involved.

"I/F Control Register Write": The command code is followed by the transmission of the single data byte to be written into the register.

Figure 7A:
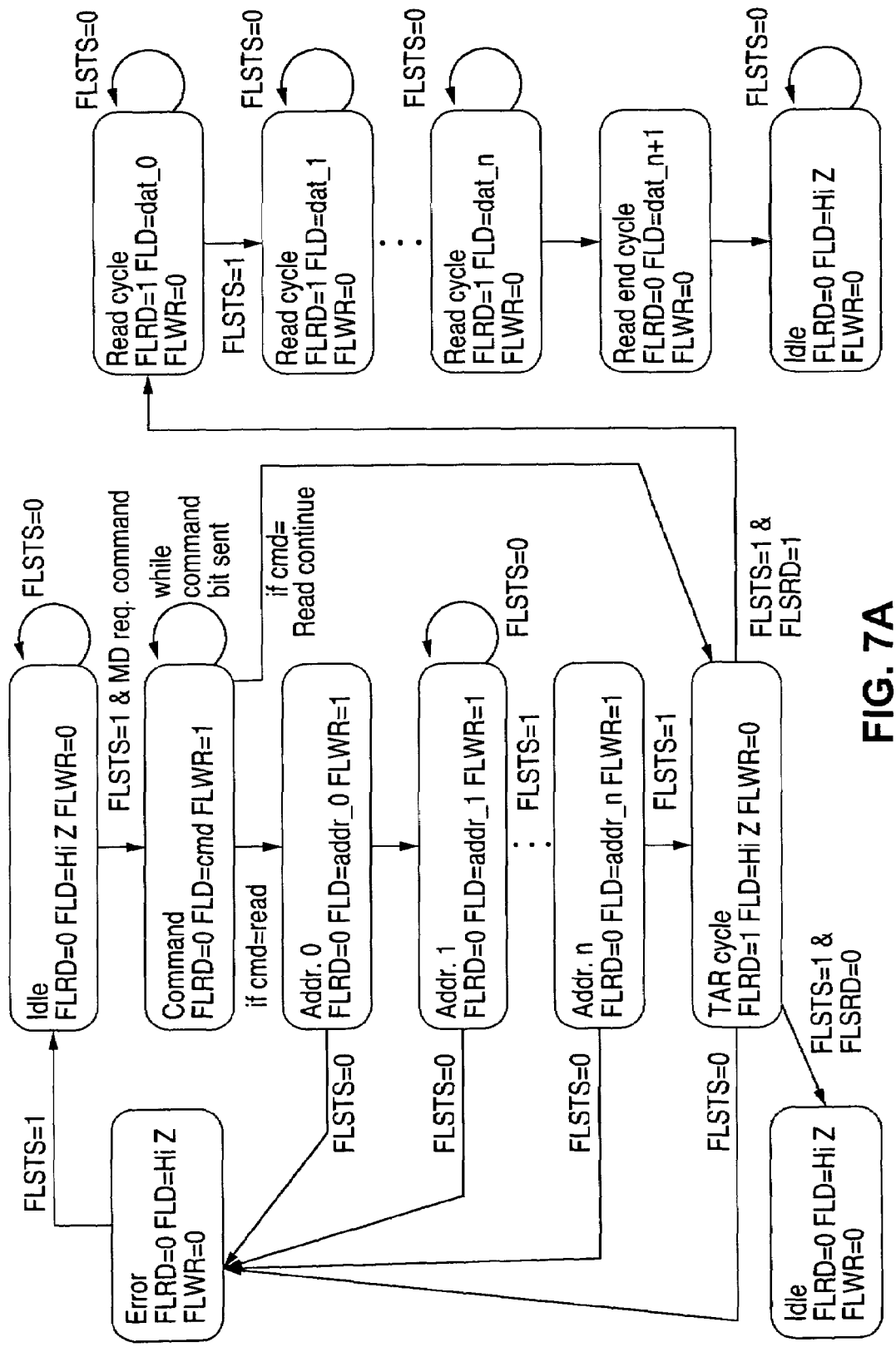
FIGS. 7A and 7B are flow diagrams for the execution of certain commands transmitted over the interface of FIG. 1.
Figure 7B:
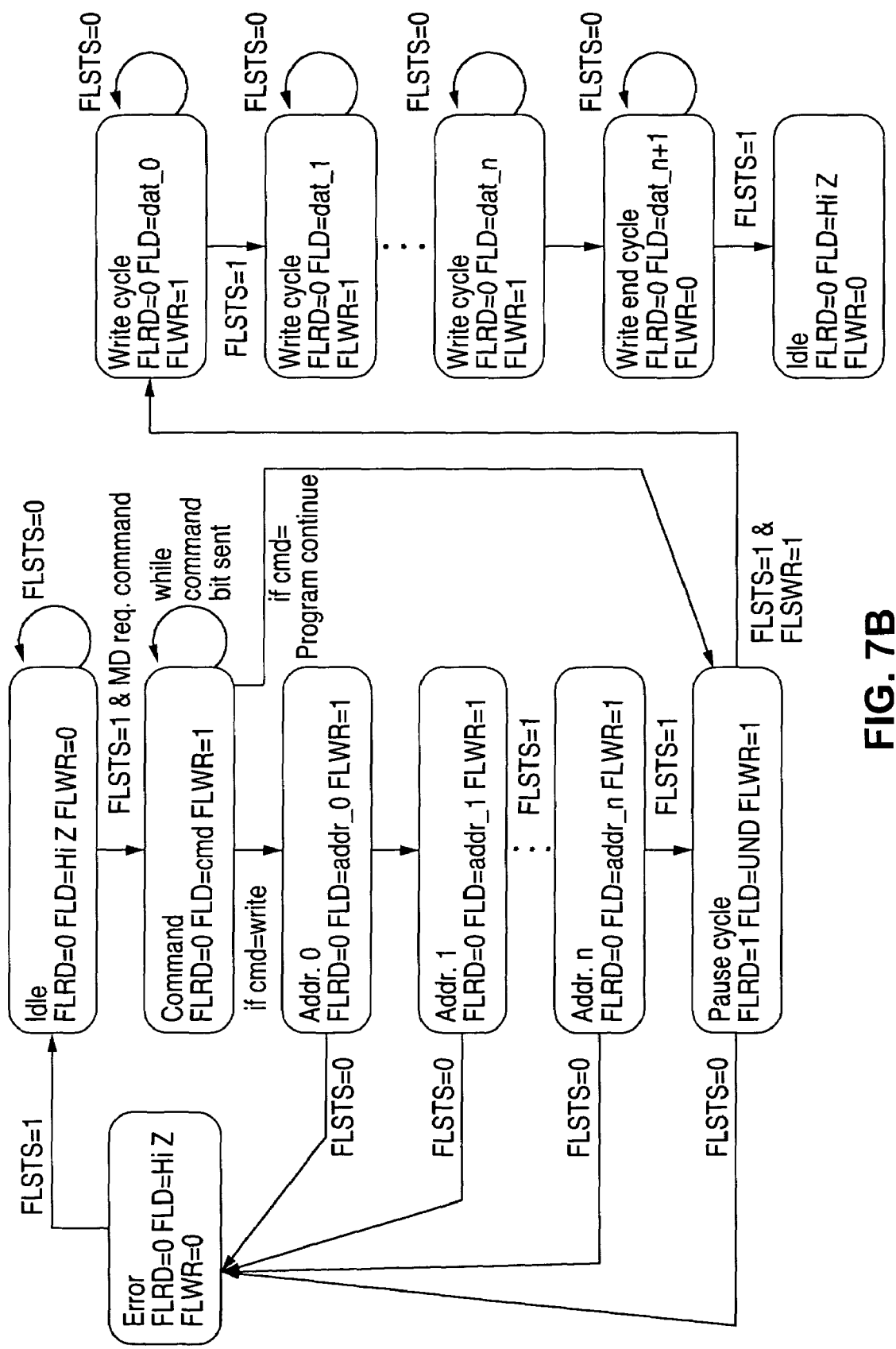

Operation of the interface with respect to the various commands will now be broadly explained, with reference to the flow diagrams of FIGS. 7A-7B and the timing diagrams of FIGS. 8A-8D. Logical states are determined by, beside the contents of the command (i.e. the signals on the data lines of the bus), the states of the other four signal lines of the bus (other than FLCLK), described above. The flow diagrams shown are for the case that the active bus width is 8 or less; for a wider bus, certain modifications of the diagrams are required, to be discussed further below.

Figure 8A:
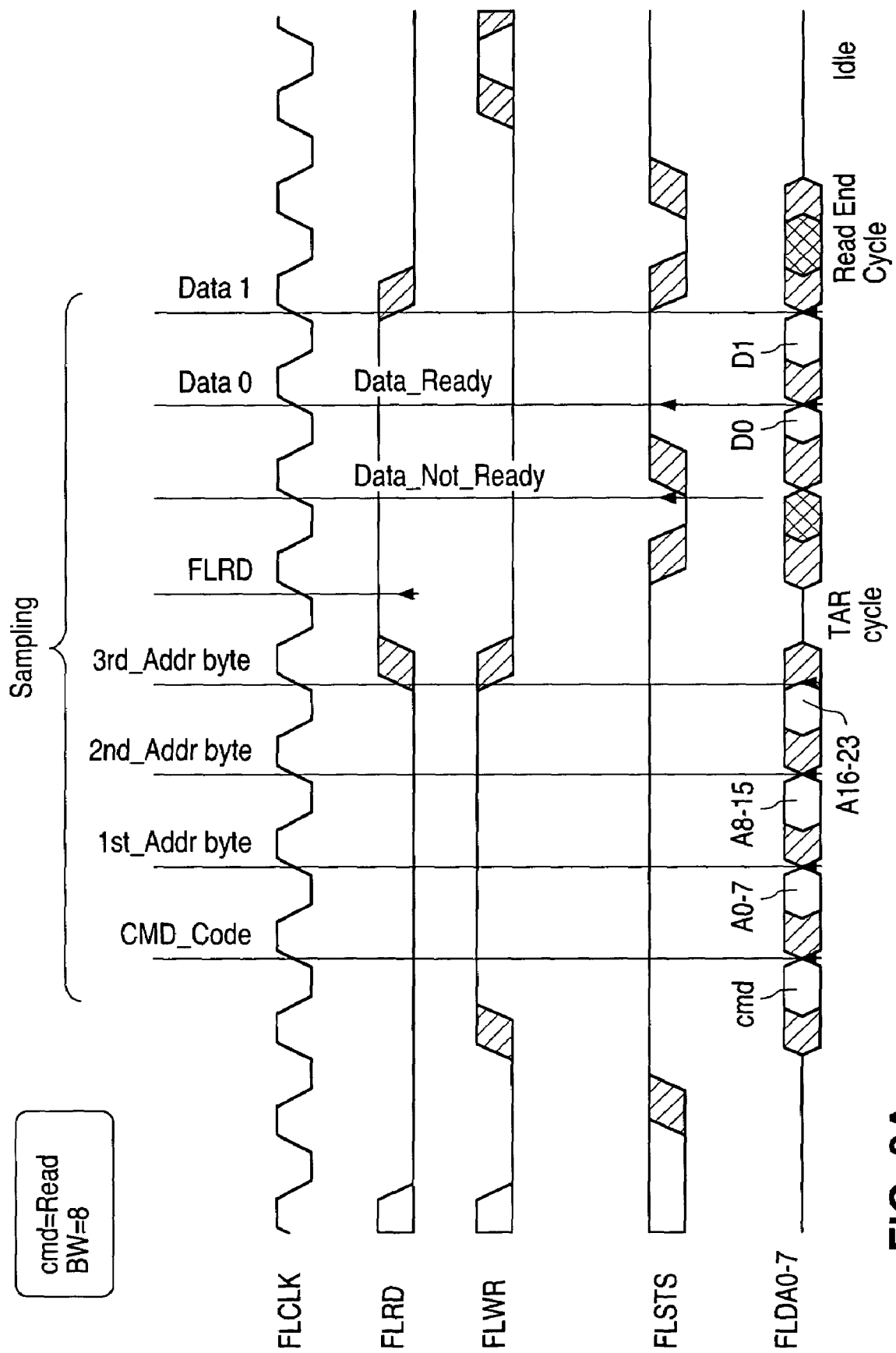
FIGS. 8A-8D are typical timing diagrams for interface signals, shown in FIG. 2, under various circumstances.

We first turn to FIGS. 7A and 8A, which pertain to Read- and Read Continue commands. A command starts when the interface is in an Idle state (i.e. waiting for a command), which is identified by the FLST signal being 1 and the FLRD and FLWR signals being 0; the data line drivers of both MD and FD are then in high impedance state (HiZ, as discussed above) and thus the data lines of the bus are in a float state). Both FD and MD identify the Idle state of the bus as an indication that the MD may send a command, when needed. Command sending starts by the MD asserting FLWR and putting the first byte (namely the Read command code) on the data lines, followed by three address bytes, as discussed above in the command description. During the first clock cycle (i.e., when FLWR=1), the FD senses data bit 0 (regardless of the bus width); if it is a '1' the command is known to be one of the last three in Table 1 (which always use the default logical bus width) and the command is received as such (i.e., using the default logical bus width); if the bit is '0' the current logical bus width, as set in the Interface Control Register, is used. Note that if the active bus width is less than 8, the transmission of each of the four bytes may involve commensurately more clock cycles; they are then transmitted consecutively with the lower order bits first (whereby data bits are always shifted in the same order). Upon sensing FLWR=1, the Bus Read/Write Transaction State Machine 16 (FIG. 4A) of the FD extracts the first byte and decodes it. If the command is Read, the next three bytes are extracted and combined to form an address, which is sent to the address buffer designated in the command-byte. If during this process FLST is de-asserted (i.e. 0), an error condition (due, for example to an illegal command or address or to a non implemented address buffer) is flagged by the FD to the MD, the MD must abort the operation and de-assert FLWR, whereupon the FD interface (and the bus) reverts back to the Idle state. It is noted that such signaling of an error by means of the single-line Status signal (otherwise serving as a Ready signal) is a novel feature of the interface according to the first and second aspects of the present invention. After the address bytes, the MD sends one Turnaround (TAR) cycle, during which it de-asserts FLWR and asserts FLRD (denoting that the transmission over the data lines will now reverse direction) and switches its data line drivers to HiZ state. If the decoded command is Read Continue, there are no address transmission cycles and the TAR cycle follows the command phase immediately. Note that the TAR cycle spans a single clock cycle at all bus widths.

At the first clock cycle after the TAR, in response to FLRD being sampled active, the FD starts driving the active data lines and thus begins the Data Phase, during which data are read out from the memory arrays 70 (FIG. 4A) (or, in the case of a register read command—from a register 12) and sent through Read Buffer 18 and Bus Serializer 17 to the bus 30. FLSTS signal, used for controlling the data flow, is generated, based on validity of the data in the Read Buffer. Note that in case of an error in the command or address phases, no data is read out of memory and the transmitted bytes will contain a constant value.

Data transmission proceeds in cycles, each spanning one or more clock cycles (depending on the number of wait cycles, as explained below) and during which one element of data is transmitted, i.e. one bit is transmitted over each active data line; a byte of data is transmitted over one or more such transmission cycles, in inverse relation to the logical bus width. During each transmission cycle of the Read Phase (referred to as a read cycle), FLSTS indicates to the MD when data are available on the bus, ready to be sampled. If FLSTS is 0, it indicates that data are not yet available (as internally to the FD, memory reading is in progress) and the MD ignores the data lines during the current clock cycle, which thus becomes a wait cycle. If FLSTS is 1, it indicates that the data are valid (i.e., the FD put the data on the data lines during the current clock cycle) and they are immediately sampled (read) by the MD. It is noted that a read cycle may not necessarily start during the clock cycle following a previous read cycle or following the TAR cycle (or during any other particular clock cycle); indeed, in the case illustrated by FIG. 8A, after the TAR cycle, one clock cycle is skipped before FLST is re-asserted and a valid data byte is on the data line. It is further noted that the FD thus uses FLSTS to control the read data flow over the bus at each bus cycle, thus, in effect, controlling the flow of each element of data; this illustrates a novel feature of the interface according to the first and second aspects of the invention, whereby operational coordination between the two devices is achieved by means of the single-line Ready signal.

Figure 8B:
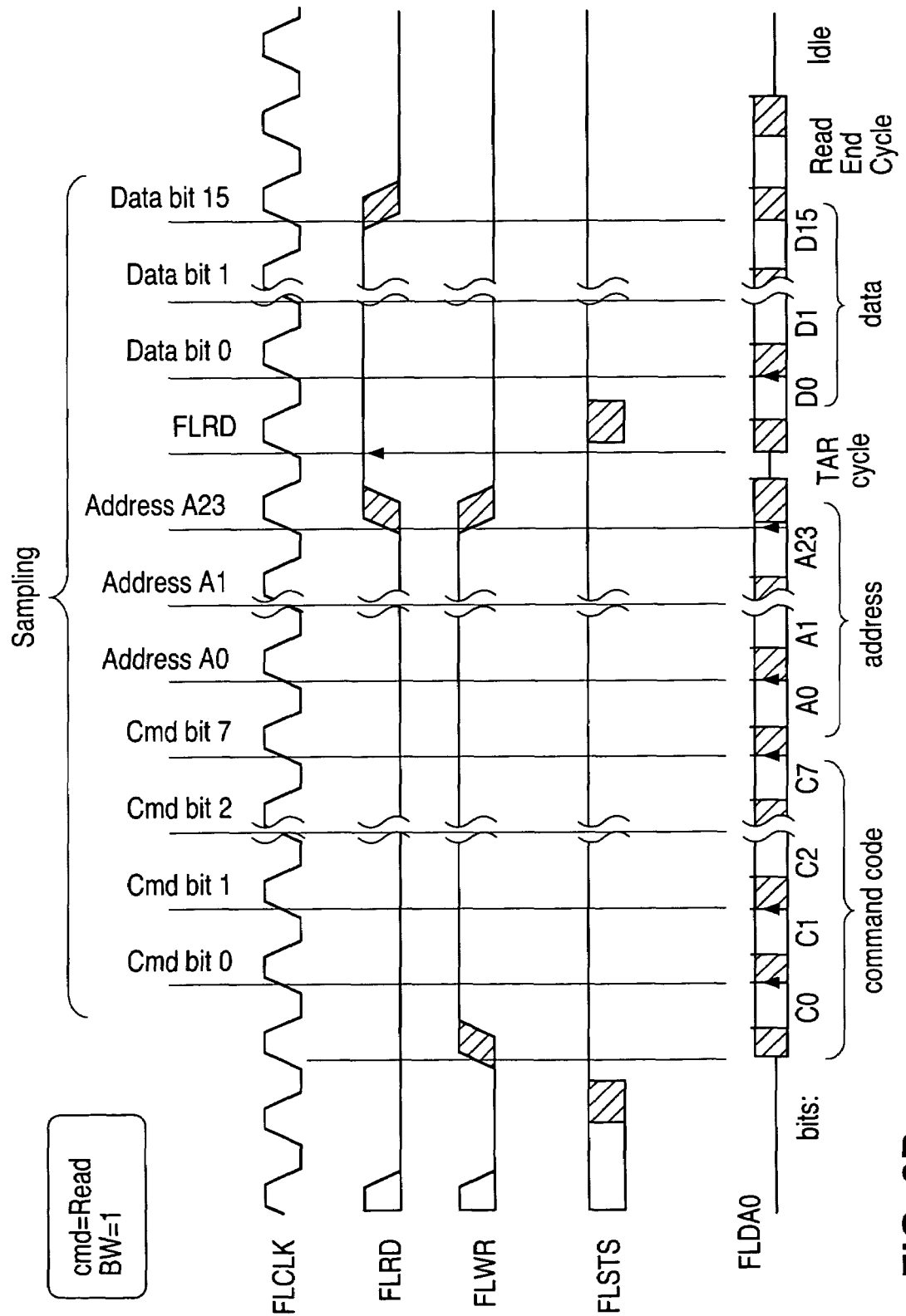

Clearly, in the case of an 8-lines bus, where a whole byte is transmitted during each read cycle, the transmission over the bus will usually be faster than the FD reading process and thus there will be a high likelihood for occurrence of wait cycles; however if the bus width is less than 8, it will take commensurately more clock cycles to transmit a byte of data and then the likelihood of waiting for a memory read operation to complete will diminish. A typical case for a single-data-line bus is illustrated in FIG. 8B, where, as may be observed, no wait cycles occur. Besides the logical bus width and the clock rate, what determines the effective read data transfer rate over the bus are, in view of the data-flow coordination effect afforded by the FLSTS signal, various parameters associated with the FD, which include the access time to the array and the amount of data read from the arrays at each access (which is a function of internal array width, i.e. word length). It is noted that, in some types of FD, several arrays may be logically combined to create a wider array (having commensurately longer words and thus effectively a higher reading rate), in which case they are all read, erased and programmed in parallel as if they were one. The data transfer rate also depend on whether the Read Buffer 18 (FIG. 4A) is implemented as a double buffer (by adding in front of it an output buffer 18'), which is used for reading data from the array while previous data are transferred over the bus, thus, in effect, pipeline the array reading with the data transfer.

In any case, the FLSTS can stall data transfer at any clock cycle (i.e. turn it into a wait cycle), based on data availability at that instance, thus effectively controlling data flow over the bus in face of any combination of the above parameters. It is noted that this control is a feature of the exemplary embodiment of the interface according to both the first and second aspects of the invention.

At the end of transmission of a data byte, the address buffer 14 in the FD (FIG. 4A) and 114 in the MD (FIG. 4B) is incremented and the process is then repeated for the next data byte and similarly—for the following ones. When the MD has received the required number of bytes (by its own count), it de-asserts FLRD; in the example of FIG. 8A, this occurs after reading two bytes. In the following clock cycle the FD switches its data line drivers to HiZ, thus floating the bus, and the FLSTS is re-asserted to '1'. Thereupon the MD and the FD interface circuits returns to the idle state (awaiting another command).

Reading data from a register proceeds in much the same way as described above, except that there is no address phase, the register to be read from being identified by the command code. Thus the TAR cycle and subsequent data transmission cycles directly follow the command cycle.

Figure 8C:
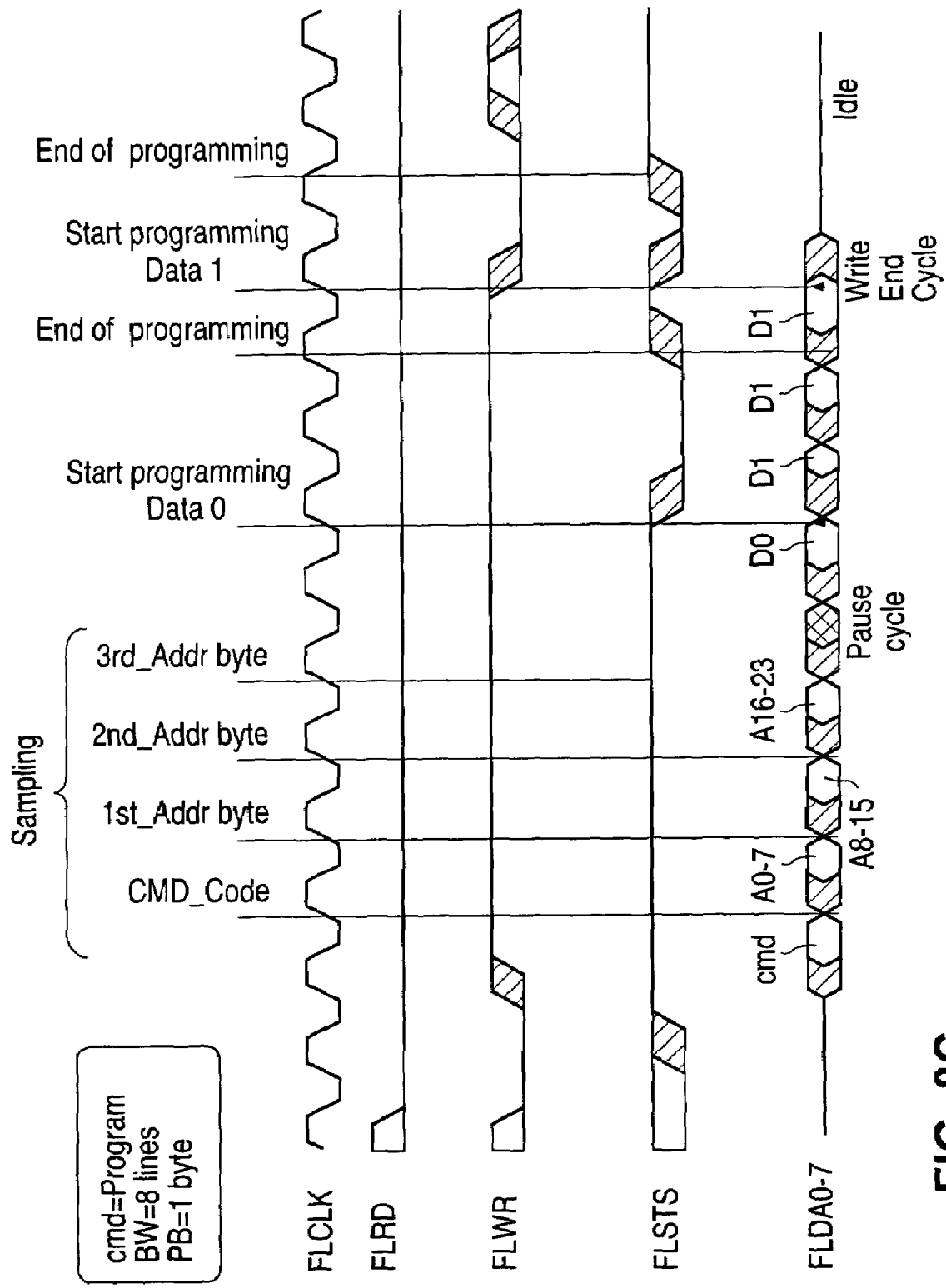

The flow of Program- and Program Continue commands, illustrated in FIGS. 7B and 8C, is similar to that illustrated in FIGS. 7A and 8A and discussed above, except as follows: FLRD remains 0 and FLWR remains 1 throughout and the bus is driven by the MD for the duration of the transaction; instead of a TAR cycle there is a Pause cycle, during which errors may be reported by de-asserting FLSTS. During the data phase, instead of Read cycles there are Program cycles; the FLSTS will indicate whether the FD has sampled the data put by the MD on the bus (FLSTS is 1), or there is a need for the MD to repeat placing the data on the bus (FLSTS is 0). The FLSTS is thus used for controlling the data flow into the FD, to achieve, inter alia, goals to be discussed below. Programming proceed in one of two ways, according to whether the FD writes bytes directly into memory locations or uses a Program Buffer 19 (FIG. 4A) to collect a batch of bytes before writing them into the memory.

The first way, whose timing is illustrated in FIG. 8C, where an 8-data-lines bus is assumed, proceeds as follows: The MD drives the first data byte; if the FD is ready, it samples the byte at the end of the clock cycle, then deasserts FLSTS. At that point the MD may begin to drive the next byte, while the FD writes the first byte into memory. As long as the programming has not completed, FLSTS remains low and the second data byte is retransmitted over another cycle. This may repeat over further cycles (two additional cycles in the illustration) until the programming of the first byte has completed, at which point FLSTS is reasserted, the second byte is sampled at the end of the current cycle and sent to memory and the process continues as described above for the first byte. When all the data bytes have been sent (i.e. two bytes in the example of FIG. 8C), the MD de-asserts FLWR and switches the data line drivers to HiZ, thus floating the bus. Consequently the FD, after sampling the last byte, may de-assert FLSTS, indicating that a program operation has begun internally. However, once FLWR is de-asserted, FLSTS is re-asserted, indicating that the bus is idle (signifying readiness for another command), regardless of whether or not the internal flash operation of programming has completed. The end of the programming operation is indicated by the Ready bit in the Device Status and Control Register.

It is noted that the batch size in this scheme may vary, depending on characteristics of the flash array. The FLSTS signal is used to control data flow to match the parameters of the flash programming delays. The time required for programming a batch of data into the flash depends on the size of the batch, the array width, the time required to write into the flash (which may vary during the life time of the flash); the batch programming time also depends on whether a verify operation is done and whether programming is re-tried in case the verify operation indicates failure. In any case, and to be noted as a feature of the exemplary interface according to the first and second aspects of the invention, the FLSTS is seen to control the programming data flow so as to match the effective transfer rate on the bus to the ability of the flash device to perform programming, in face of widely varying parameters associated with the programming process.

Figure 8D:
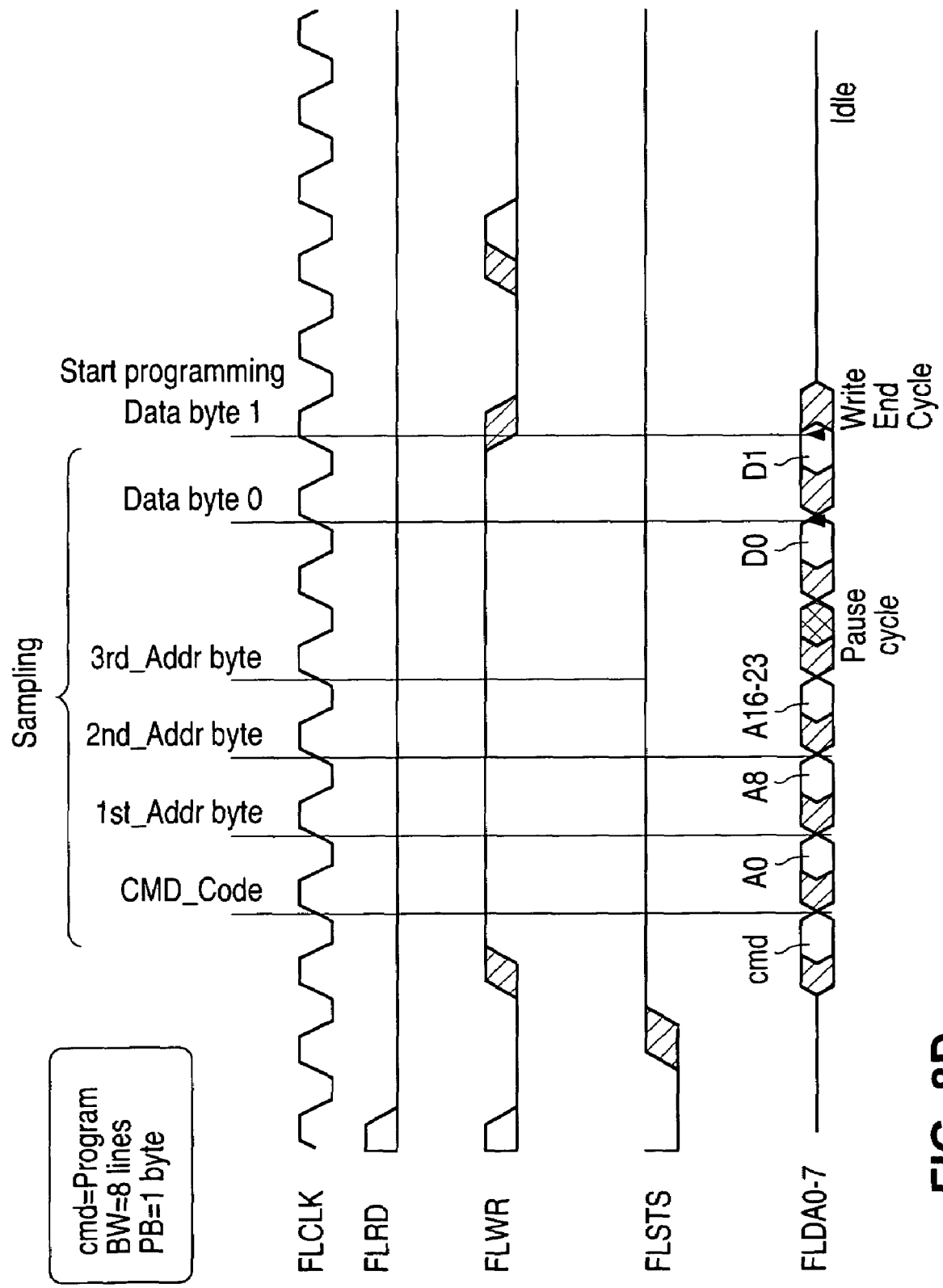

The second way for handling data to be programmed into memory uses Program Buffer 19 (FIG. 4A) on the FD, which, in this case, serves to store one or more data bytes, to be programmed as a batch. Timing of signals when going this way is illustrated in FIG. 8D. It is seen here that FLSTS remains asserted throughout and all transmitted bytes are sampled without any delay, as they are written into the buffer. As before, when all the data bytes have been sent (again two bytes in the example of FIG. 8D), the MD de-asserts FLWR and switches the data lines to HiZ. Consequently the FD proceeds to write the data from the buffer into the memory (regardless of whether the buffer is full or not). After completion of programming, the FD may verify its correctness by comparing the affected memory contents with the contents of the Program Buffer; if an error is detected, it may re-try to perform the programming operation, using the data in the buffer, and to re-verify. If at the end of this process the programming has failed, it is signaled by bit 2 of the Device Status and Control register (FIG. 5A).

The size of the Program Buffer is a parameter that affects the speed of programming; moreover, as described above, it may be formed as a double buffer, consisting of an Input Buffer 19' and a Program Buffer 19. During a program operation, data to be programmed into memory are read from the Program Buffer, a byte or a word at a time (up to an array-width worth of data, depending on how much data may be programmed at once to the memory array), while at the same time additional data for a subsequent operation is transmitted over the bus into the input buffer. Once the current program operation has completed, the new data are transferred from the Input Buffer into the Program Buffer (for writing into memory) and bit 1 of the Device Status and Control register is set, signaling that the input buffer is ready for another transmission. It is observed that, in this case, the programming operation is done in parallel to data transfer over the bus and thus the effective rate of programming may increase. However, the data flow control function of the FLSTS still has the task of balancing data transfer time (which may vary according to bus clock rate and logical bus width) with the programming time; in the case that the transfer rate is higher than the programming rate, FLSTS is de-asserted, stalling the communication as long as the Input Buffer is full.

In devices that support read-parallel-to-program it may be possible to read from one memory location simultaneously with programming to another location when this capability is enabled. In this case, stalling of the bus, owing to Input- or Program Buffer being full, may be avoided by using the Double Buffer Empty status bit in the Device Status and Control Register to determine when a buffer-full of data can be written without causing a stall. The design and operation of the present interface guarantee that a full buffer situation, with its attendant bus stalling, is avoided and that, in any case, any operation will be handled correctly, regardless of flash programming parameters (as discussed above) or bus data transfer rates.

It is noted that during all Read, Read Continue, Program and Program-Continue operations, the MD has, at all times, control over the amount of data transferred, by means of the appropriate FLRD and FLWR signals (keeping them asserted until the desired amount of data is transferred). The MD may, for example, de-assert the FLRD or FLWR signal at any time that a change in data needs occurs (e.g., an internal abort) or in case of a need to free the bus for other operations (monitoring the Ready bit in the Status register, a stalled state of a program operation) or a priority change in the MD.

Writing data into a register proceeds in much the same way as described above with respect to FIG. 7B, except that the byte sequence that follows the command cycle may not include transmission of addresses and may include a transmission of codes (for reducing a chance of error), the register to be written into being identified by the command code.

An Erase transaction is handled in a way similar to programming except that there is no data phase. A feature of another configuration of the exemplary interface, according to the fifth aspect of the invention, is directed to memory devices that are not self timed, i.e. do not have an internally generated clock signal (or other time base circuits, such as one-shots) from which to derive timing signals for their internal operation, and thus need an externally supplied clock signal. In keeping with the principle of universality that underlies the interface of the present invention, this feature enables such non-self-timed memory devices to derive their timing from the clock signal that flows through the bus, as described above. It is noted that the interface of the invention does not specify a particular frequency for this clock; this frequency is usually determined as part of the design of the main device and may vary among different types of such a device; it certainly cannot be made, in general, to depend on the type of memory device being used (except for some bandwidth limits, determined by its technology).

Figure 9:
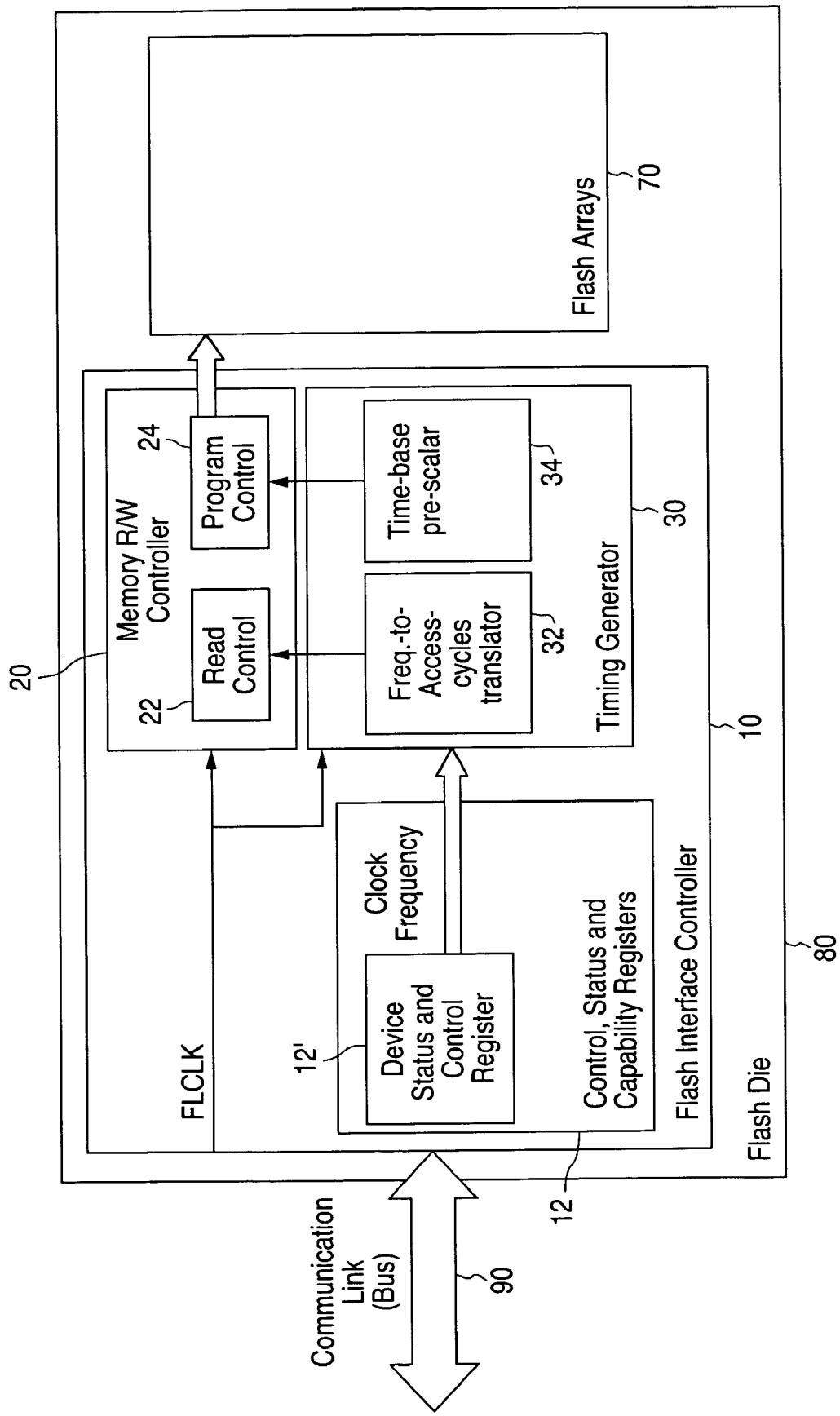
FIG. 9 is a variation of FIG. 4, showing a typical embodiment of a timing signal generator on the memory device that is driven by the bus clock of the interface.

FIG. 9 depicts in a block diagram (which shows variations from that of FIG. 4A) an embodiment of this capability in a flash memory die. This diagram shows the optional module providing the capability, namely the Timing Generator 30, but leaves out some of the modules shown in FIG. 1A, for clarity. Timing Generator 30 includes two sub-modules, 32 and 34, which adjust the internal timing of the flash memory to the variable frequency of the input clock signal; two other sub-modules, 22 and 24, are modifications of circuits commonly present in Memory Read/Program Controller 20, which control memory read- and program operations, respectively. In addition to the clock signal, FLCLK, obtained from the corresponding bus line, Timing Generator 30 obtains, as input, the value of the clock frequency; this is stored in Device Status and Control Register 12—for example, in bits 8-15, as shown in FIG. 5A, (after having been written there through an appropriate command from the main device).

The Frequency-to-Access-Cycles Translator sub-module 32 translates the clock frequency value into a number of clock cycles required to complete a read operation from a memory array. In one embodiment it includes a logic circuit that emulates a look-up table, listing the number of clock cycles that corresponds to each clock frequency, or range of frequencies.

Note that the term look-up table is used here only in the functional sense; since operation of the Translator cannot tolerate delays typically associated with an actual look up tables, the implementation of this function is preferably by means of logic gates. The number of clock cycles is passed on to Read Control sub-module 22, which generates delays appropriate to the time required for accessing data in a specific array; (the value of which varies according to the technology in use, the array size and other design parameters). One implementation of this sub-module is a down-counter; when the counter reaches zero, the read data are known to be available at the output of the array and are put in the Read Buffer 18 (FIG. 4A) for transfer over the bus.

The Time-Base Prescaler sub-module 34 continuously converts the input clock signal into an internal clock signal (usually of considerably lower frequency), by dividing its frequency by a factor proportional to the given frequency value (conveyed by the Device Status and Control Register 12'); such frequency division is commonly known in the art. The derived internal clock signal is applied to Program Control sub-module 24, which generates the required timing for the flash program and erase operations. Due to the longer periods of time required for these operations, it can be based on a clock whose frequency is obtained by dividing down the input clock signal FLCLK, whatever its frequency. For example, if a 1 μsec granularity is required, the input clock is divided by its frequency, in MHz. It is noted that tolerance in timing requirements of the array may be utilized to simplify the frequency dividing circuit; for example, a frequency of both 33 MHz and 33.5 MHz may be divided by 33 to approximately achieve a 1 μsec time base. A verify operation of the programmed data may use internally the timing circuits of the flash read mechanism.

In order to save power in the flash die, the clock may be stopped between transactions, when no data is being transmitted over bus and as long as there are no program or erase operations executed in the background, as indicated by the Ready bit in the Device Status and Control register.

As will be recalled, the interface according to the invention is adaptable to various physical bus-widths, that is—to various numbers of data lines (FLDA—FIG. 2) linking the two devices. In order to facilitate such adaptability not only logically but also physically, i.e. in terms of die layout, when the dies are packaged in a stacked manner, it is stipulated in the exemplary embodiment that all pads on the memory die that are to be wired to corresponding pads on the main die are to be located only along two adjacent edges of the memory die; preferably all pads that form parts of the data lines (FLDA) will be located along a single edge, except that, according to an alternative configuration, pads corresponding to data lines that are included in the default logical bus width (e.g. a single line, carrying signal FLDA0, as in the exemplary embodiment) may possibly be on the adjacent edge. An example of such an arrangement is shown schematically in FIG. 10A, which depicts, in top view, three exemplary instances of a flash die 80 lying over a main die 100, the physical bus-width being different among the instances: in the instance shown at the top the drawing, the width is 8, in that shown in the middle, the width is 4 and in the one shown at the bottom, it is 2. In the top-shown instance of this example there are eight pads 82' along the right-hand edge of the FD, which serve for data lines FLDA0-FLDA7, and five pads 82 along the upper edge, serving for the other five signal lines of FIG. 2; additional pads on either edge (not shown) serve for voltage supply lines. These are connected to corresponding pads 102' and 102, respectively along proximate edges of the main die. Other pads 103 on the main die serve for external connections. It will now be readily appreciated that the same MD could be coupled with any other type of FD, having a smaller physical bandwidth, i.e. fewer data line pads, by directly connecting to just these pads without having to reposition corresponding pads on the main die. Such a FD would presumably be smaller and, in any case, the die and the pads would be positioned so as to begin close to the top edge of the main die, as they also do in the example of FIG. 10. The two other instances shown in FIG. 10A illustrate this principle for bus-widths of 4 and 2, respectively. This principle of aligning all data line pads, possibly except those serving default data lines, along one edge of the MD in order to be connectable to FDs having various physical bus widths is a feature of the exemplary interface according to the third aspect of the invention.

Clearly the same principle can be extended to wider buses, e.g. up to 32 data lines. In the latter case, for example, a maximum-bus-width flash die would have 32 pads along its right edge (or, as an alternative example, 16 pads along each of the two adjacent edges) and the main die would have at least 32 pads along the corresponding edge (or edges). That main die could then be coupled to memory dies of narrower bus-widths, say 16 or 8, by positioning the flash die and its pads near the upper right hand corner and connecting only the corresponding pads of the main die.

Figure 10B:
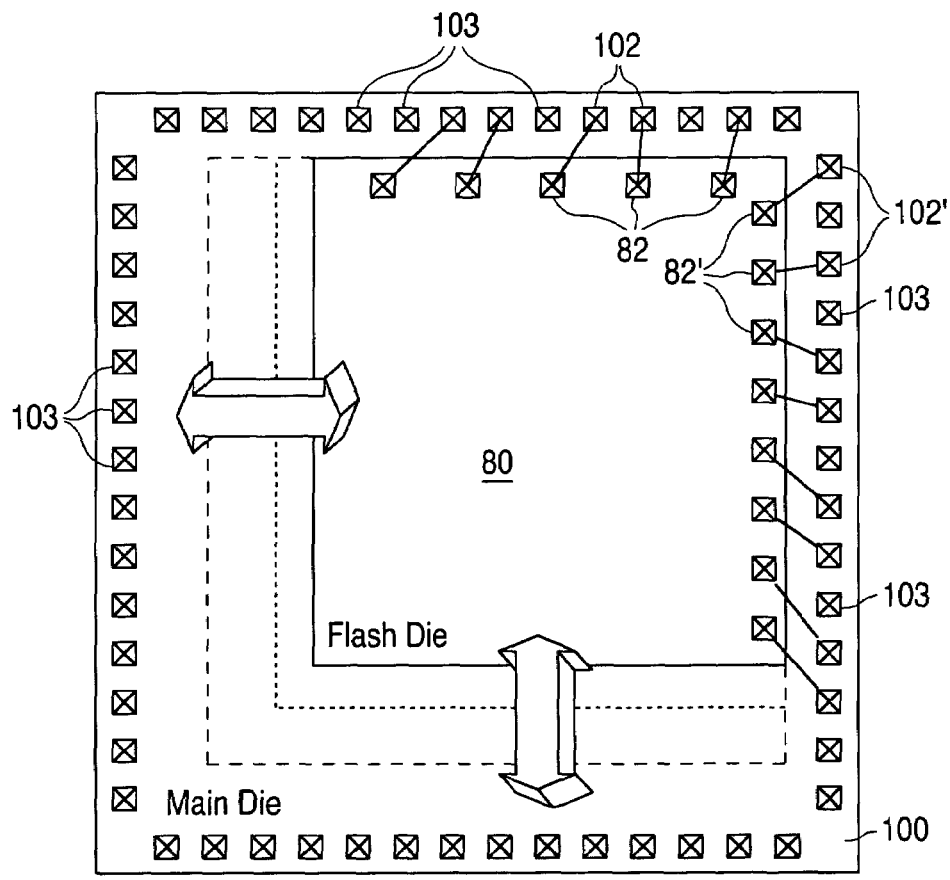

FIG. 10B illustrates another advantage to confining all pads of the memory die to two adjacent edges. This arrangement enables coupling any given main die 100 with memory dies 80 of a variety of sizes, without having to reposition any of its pads. FIG. 10B demonstrates this ability with the outlines of three exemplary sizes of a flash die 80, the die being always positioned so that its pads are at an appropriate distance from the corresponding pads along adjacent edges of the main die. The arrows symbolize the allowed variability of positions of the other two edges of the flash die. It will be appreciated that if, contrary to the invention, there were pads also along any of these other two edges, corresponding pads on the main die would generally have to be positioned accordingly, requiring a different circuit layout for each size (or range of sizes) of the flash die and either differently sized main dies or pads within the circuit area of a standard-sized main die. With the pad arrangement of the invention, on the other hand, a standard main die, with a standard layout of pads and circuits, may accommodate a variety of memory die sizes, having a variety of physical bandwidths. This arrangement, of confining all interconnection pads to two adjacent edges of the FD in order to enable a variety of FD die sizes to be connected to a given MD circuit layout, constitutes another feature of the exemplary interface according to the third aspect of the invention. While the preceding described a particular embodiment of the various aspects of the invention, including a particular communication protocol and particular configuration and architectures of the connected devices, and directed at a particular form of the devices and a particular class of memory devices, it will be appreciated that the invention, in its various aspects, can be embodied in many other forms and configurations, including different communication protocols and device architectures, and be applicable also to other forms of devices and classes of memory devices, all coming within the scope of the invention, as defined solely by the following claims. In the method claims that follow, alphabetic characters used to designate claim steps are provided for convenience only and do not imply any particular order of performing the steps.

A semiconductor die, comprising a plurality of interconnection pads for connecting with a memory die, the two dies packaged together in a stacked manner, wherein the pads are disposed so that the circuit layout of the semiconductor die is invariable with respect to the size of the memory die, within a given range of sizes. Also, when at least two of the pads form, each, part of a corresponding data line, for carrying data signals between the two dies, these pads are disposed so that the circuit layout of the semiconductor die is invariable with respect to the connected number of data lines, up to a given maximum number.

TABLE 1

Commands Structure

| Command Name | Cycle Number: 1 contents | R/W | 2 contents | R/W | 3 contents | R/W | 4 contents | R/W | 5 contents | R/W | Note |
|---|---|---|---|---|---|---|---|---|---|---|---|
| Read | 0xn0 | W | A07-A00 | W | A15-A08 | W | A23-A16 | W | data | R | 1 |
| Read Continue | 0xn4 | W | data | R | | | | | | | 2 |
| Program | 0xn2 | W | A07-A00 | W | A15-A08 | W | A23-A16 | W | data | W | 1 |
| Program Continue | 0xn6 | W | data | W | | | | | | | 2 |
| Page Erase | 0x08 | W | A07-A00 | W | A15-A08 | W | A23-A16 | W | | | 3 |
| Information Block Section Erase | 0x18 | W | A07-A00 | W | A15-A08 | W | A23-A16 | W | | | |
| Main Block Section Erase | 0x28 | W | A07-A00 | W | A15-A08 | W | A23-A16 | W | | | |
| Complete Section Erase | 0x38 | W | A07-A00 | W | A15-A08 | W | A23-A16 | W | | | |
| Chip Erase | 0x48 | W | 0x55 | W | 0x22 | W | 0xAA | W | 0xEE | W | |
| Device Capabilities Register Read | 0x0A | W | data_0 | R | data_1 | R | data_2 | R | data_3 | R | |
| Section Capabilities Register Read | 0x8A-0xFA | W | data_0 | R | data_1 | R | data_2 | R | data_3 | R | |
| Device Status and Control Register Read | 0x0C | W | data_0 | R | data_1 | R | | | | | |
| Device Ready Status Read | 0x1C | W | Ready | | | | | | | | 4 |
| Device Status and Control Register Write | 0x0E | W | 0x55 | W | 0x22 | W | data_0 | W | data_1 | W | |
| Program Protect Control Register Read | 0x8C | W | data_0 | R | | | | | | | |
| Program Protect Control Register Write | 0x8E | W | 0x55 | W | 0x22 | W | data_0 | W | | | |
| ID Register Read | 0x01 | W | data_0 | R | data_1 | R | data_2 | R | data_3 | R | 5 |
| Enter Test Mode | 0x8F | W | 0xAA | W | 0xEE | W | 0x55 | W | 0x22 | W | |
| I/F Control Register Write | 0xFF | W | data | W | | | | | | | |

Notes to Table 1:
1 Fifth cycle can be repeated with address auto increment; 'n' in the command code is the designation number of the address buffer to be used; n = 0xF indicates reading/writing from/to an information block
2 Second cycle can be repeated with address auto increment; 'n' in the command code is the designation number of the address buffer to be used; n = 0xF indicates reading/writing from/to an information block
3 Any address within the erased range; for Information Block Section Erase and Complete Section Erase, the address should be within the information block range of the section.
4 Second cycle can be repeated for continuous monitoring of Ready status.
5 Always use 1-data-line bus; all other data lines are invalid.

TABLE 2

Commands structure for bus width 16 (samples)

| Command name | Bus cycle number: 1 Byte L* | byte H | R/W | 2 byte L | byte H | R/W | 3 byte L | byte H | R/W | Notes |
|---|---|---|---|---|---|---|---|---|---|---|
| Read | 0xn0 | A07-A00 | W | A15-A08 | A23-A16 | W | data | data | R | 1 |
| Read Continue | 0xn4 | | W | data | data | R | | | | 2 |
| Page Erase | 0x08 | A07-A00 | W | A15-A08 | A23-A16 | W | | | | 3 |
| Chip Erase | 0x48 | | W | 0x55 | 0x22 | W | 0xAA | 0xEE | W | |

TABLE 2-continued

Commands structure for bus width 16 (samples)

| | Bus cycle number: | | | | | | | | |
|---|---|---|---|---|---|---|---|---|---|
| | 1 | | | 2 | | | 3 | | |
| Command name | Byte L* | byte H | R/W | byte L | byte H | R/W | byte L | byte H | R/W | Notes |
| Device Capabilities Register Read | 0x0A | — | W | data_0 | data_1 | R | data_2 | data_3 | R | |
| Device Status and Control Register Write | 0x0E | | W | 0x55 | 0x22 | W | data | | W | |

* 'n' is the designation of the address buffer to be used
** A = address bit
Notes:
1 $3^{rd}$ cycle can be repeated with address auto increment
2 $2^{nd}$ cycle can be repeated with address auto increment
3 any address within the erased area

TABLE 3

Commands structure for bus width 32 (samples)

| | Cycle Number: | | | | | | | | | | | | | |
|---|---|---|---|---|---|---|---|---|---|---|---|---|---|---|
| | 1** | | | | | 2 | | | | | 3 | | | | |
| Command name | byte L* | byte 1 | byte 2 | byte H | R/W | byte L | byte 1 | byte 2 | byte H | R/W | byte L | byte 1 | byte 2 | byte H | R/W | Notes |
| Read | 0xn0 | A07-A00 | A15-A08 | A23-A16 | W | | data | | | R | | | | | | 2 |
| Read Continue | 0xn4 | | | | W | | data | | | R | | | | | | 2 |
| Page Erase | 0x08 | A07-A00 | A15-A08 | A23-A16 | W | | | | | | | | | | | 3 |
| Chip Erase | 048x | | | | W | 0x55 | 0x22 | 0x22 | 0x55 | W | 0xAA | 0xEE | 0xAA | 0xEE | W | |
| Device Capabilities Register Read | 0x1C | — | — | — | W | data_0 | data_1 | data_2 | data_3 | R | | | | | | |
| Device Status and Control Register Write | 0x0E | | | | W | 0x55 | 0x22 | 0x22 | 0x55 | W | | data | | | W | |

* 'n' is the designation of the address buffer to be used
** A = address bit
Notes:
2 $2^{nd}$ cycle can be repeated with address auto increment
3 any address within the erased area

What is claimed is:

1. A die, comprising:

a plurality of interconnection pads for connecting with a second die when the die and the second die are packaged together in a stacked manner, wherein the interconnection pads are disposed so that a layout of the interconnection pads on the die is invariable with respect to at least one of: a size of the second die and a number of data lines for carrying data signals between the die and the second die, the data lines including at least one default data line and two or more other data lines;

wherein the interconnection pads are disposed only along two mutually adjacent edges of the die, wherein at least one interconnection pad to be coupled to the at least one default data line is disposed on a first edge of the die, wherein two or more interconnection pads to be coupled to the two or more other data lines are disposed along a second edge of the die, and wherein the two or more other data lines are indexed in a sequential order and the two or more interconnection pads are disposed along the second edge of the die in the sequential order in which the two or more other data lines are indexed.

2. The die of claim 1, wherein one of:

the die comprises a semiconductor die and the second die comprises a memory die; and the die comprises the memory die and the second die comprises the semiconductor die.

3. The die of claim 2, wherein:

the semiconductor die comprises a processor; and the memory die comprises a non-volatile memory.

4. A die, comprising:

a plurality of interconnection pads for connecting with a second die when the die and the second die are packaged together in a stacked manner, wherein the interconnection pads are disposed so that a layout of the interconnection pads on the die is invariable with respect to at least one of: a size of the second die and a number of data lines for carrying data signals between the die and the second die, the data lines including at least one default data line and two or more other data lines;

wherein at least three of the interconnection pads form portions of the data lines for carrying the data signals between the die and the second die, wherein at least one interconnection pad forming a portion of the at least one default data line is disposed on a first edge of the die, wherein two or more interconnection pads forming portions of the two or more other data lines are disposed along a second edge of the die, and wherein the two or more other data lines are indexed in a sequential order and the two or more interconnection pads are disposed along the second edge of the die in the sequential order in which the two or more other data lines are indexed.

5. The die of claim 4, wherein one of:
the die comprises a semiconductor die and the second die comprises a memory die; and
the die comprises the memory die and the second die comprises the semiconductor die.

6. The die of claim 5, wherein:
the semiconductor die comprises a processor; and
the memory die comprises a non-volatile memory.

7. A die package, comprising:
a first die comprising a plurality of first interconnection pads;
a second die comprising a plurality of second interconnection pads, the second die stacked on the first die; and
multiple connections coupling at least some of the second interconnection pads to at least some of the first interconnection pads to form data lines including at least one default data line and two or more other data lines;
wherein the first interconnection pads are disposed on the first die such that a layout of the first interconnection pads on the first die is invariable with respect to at least one of: a size of the second die and a number of data lines for carrying data signals between the dies;
wherein the first interconnection pads are disposed only along two mutually adjacent edges of the first die;
wherein the second interconnection pads are disposed only along two mutually adjacent edges of the second die;
wherein at least one first interconnection pad coupled to the at least one default data line is disposed on a first edge of the first die, and at least one second interconnection pad coupled to the at least one default data line is disposed on a first edge of the second die;
wherein the two or more other data lines are indexed in a sequential order;
wherein two or more first interconnection pads coupled to the two or more other data lines are disposed along a second edge of the first die in the sequential order in which the two or more other data lines are indexed; and
wherein two or more second interconnection pads coupled to the two or more other data lines are disposed along a second edge of the second die in the sequential order in which the two or more other data lines are indexed.

8. The die package of claim 7, wherein one of:
the first die comprises a semiconductor die and the second die comprises a memory die; and
the first die comprises the memory die and the second die comprises the semiconductor die.

9. The die package of claim 8, wherein:
the semiconductor die comprises a processor; and
the memory die comprises a non-volatile memory.

10. A die package, comprising:
a first die comprising a plurality of first interconnection pads;
a second die comprising a plurality of second interconnection pads, the second die stacked on the first die; and
multiple connections coupling at least some of the second interconnection pads to at least some of the first interconnection pads to form data lines including at least one default data line and two or more other data lines;
wherein the first interconnection pads are disposed on the first die such that a layout of the first interconnection pads on the first die is invariable with respect to at least one of: a size of the second die and a number of data lines for carrying data signals between the dies;
wherein at least one first interconnection pad and at least one second interconnection pad form portions of the at least one default data line and are disposed on a first edge of the first die and a first edge of the second die, respectively;
wherein two or more first interconnection pads and two or more second interconnection pads form portions of the two or more other data lines;
wherein the two or more other data lines are indexed in a sequential order;
wherein the two or more first interconnection pads forming portions of the two or more other data lines are disposed along a second edge of the first die in the sequential order in which the two or more other data lines are indexed; and
wherein the two or more second interconnection pads forming portions of the two or more other data lines are disposed along a second edge of the second die in the sequential order in which the two or more other data lines are indexed.

11. The die package of claim 10, wherein one of:
the first die comprises a semiconductor die and the second die comprises a memory die; and
the first die comprises the memory die and the second die comprises the semiconductor die.

12. The die package of claim 11, wherein one of:
the semiconductor die comprises a processor; and
the memory die comprises a non-volatile memory.

13. A method for packaging dies, comprising:
stacking a first die and a second die, the first die comprising a plurality of first interconnection pads, the second die comprising a plurality of second interconnection pads, the first interconnection pads disposed on the first die such that a layout of the first interconnection pads on the first die is invariable with respect to at least one of: a size of the second die and a number of data lines for carrying data signals between the dies; and
coupling at least some of the second interconnection pads and at least some of the first interconnection pads to the data lines, the data lines including at least one default data line and two or more other data lines;
wherein the first interconnection pads are disposed only along two mutually adjacent edges of the first die;
wherein the second interconnection pads are disposed only along two mutually adjacent edges of the second die;
wherein at least one first interconnection pad coupled to the at least one default data line is disposed on a first edge of the first die, and at least one second interconnection pad coupled to the at least one default data line is disposed on a first edge of the second die;
wherein the two or more other data lines are indexed in a sequential order;
wherein two or more first interconnection pads coupled to the two or more other data lines are disposed only along a second edge of the first die in the sequential order in which the two or more other data lines are indexed; and
wherein two or more second interconnection pads coupled to the two or more other data lines are disposed only along a second edge of the second die in the sequential order in which the two or more other data lines are indexed.

14. The method of claim 13, wherein:
the first die comprises a processor; and
the second die comprises a non-volatile memory.

15. The method of claim 13, wherein one of:
the first die comprises a semiconductor die and the second die comprises a memory die; and
the first die comprises the memory die and the second die comprises the semiconductor die.

16. A method for packaging dies, comprising:
stacking a first die and a second die, the first die comprising a plurality of first interconnection pads, the second die comprising a plurality of second interconnection pads, the first interconnection pads disposed on the first die such that a layout of the first interconnection pads on the first die is invariable with respect to at least one of: a size of the second die and a number of data lines for carrying data signals between the dies; and
coupling at least some of the second interconnection pads to at least some of the first interconnection pads to form the data lines, the data lines including at least one default data line and two or more other data lines;
wherein at least one first interconnection pad and at least one second interconnection pad form portions of the at least one default data line and are disposed on a first edge of the first die and a first edge of the second die, respectively
wherein two or more first interconnection pads and two or more second interconnection pads form portions of the two or more other data lines;
wherein the two or more other data lines are indexed in a sequential order;
wherein the two or more first interconnection pads forming the portions of the two or more other data lines are disposed only along a second edge of the first die in the sequential order in which the two or more other data lines are indexed; and
wherein the two or more second interconnection pads forming the portions of the two or more other data lines are disposed only along a second edge of the second die in the sequential order in which the two or more other data lines are indexed.

17. The method of claim 16, wherein one of:
the semiconductor die comprises a processor; and
the memory die comprises a non-volatile memory.

18. The method of claim 17, wherein:
the first die comprises a processor; and
the second die comprises a non-volatile memory.

19. A die package, comprising:
a first die comprising a plurality of first interconnection pads;
a second die comprising a plurality of second interconnection pads, the second die stacked on the first die; and
multiple connections coupling at least some of the second interconnection pads to at least some of the first interconnection pads to form data lines;
wherein the first interconnection pads are disposed on the first die such that a layout of the first interconnection pads on the first die is invariable with respect to at least one of: a size of the second die and a number of data lines for carrying data signals between the dies;
wherein the data lines include at least one default data line and at least one other data line;
wherein at least one first interconnection pad and at least one second interconnection pad form portions of the at least one default data line and are located along a first edge of the first die and a first edge of the second die, respectively;
wherein at least one other first interconnection pad and at least one other second interconnection pad form portions of the at least one other data line and are located along a second edge of the first die and a second edge of the second die, respectively; and
wherein the first and second edges of the first die are adjacent to one another, and the first and second edges of the second die are adjacent to one another.

20. The die package of claim 19, wherein:
the first die comprises a processor; and
the second die comprises a nonvolatile memory.

* * * * *

UNITED STATES PATENT AND TRADEMARK OFFICE
CERTIFICATE OF CORRECTION

PATENT NO.       : 7,579,683 B1
APPLICATION NO.  : 10/934113
DATED            : August 25, 2009
INVENTOR(S)      : Falik et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 984 days.

Signed and Sealed this

Fourteenth Day of September, 2010

David J. Kappos
*Director of the United States Patent and Trademark Office*